(12) United States Patent
De Bosscher et al.

(10) Patent No.: US 10,163,611 B2
(45) Date of Patent: Dec. 25, 2018

(54) DEVICE HAVING TWO END BLOCKS, AN ASSEMBLY AND A SPUTTER SYSTEM COMPRISING SAME, AND A METHOD OF PROVIDING RF POWER TO A TARGET ASSEMBLY USING SAID DEVICE OR ASSEMBLY

(71) Applicant: SOLERAS ADVANCED COATINGS BVBA, Deinze (BE)

(72) Inventors: Wilmert De Bosscher, Drongen (BE); Ivan Van De Putte, Waregem (BE)

(73) Assignee: SOLERAS ADVANCED COATINGS BVBA, Deinze (BE)

( * ) Notice: Subject to any disclaimer, the term of this patent is extended or adjusted under 35 U.S.C. 154(b) by 0 days.

(21) Appl. No.: 15/533,901

(22) PCT Filed: Dec. 8, 2015

(86) PCT No.: PCT/EP2015/079040
§ 371 (c)(1),
(2) Date: Jun. 7, 2017

(87) PCT Pub. No.: WO2016/091915
PCT Pub. Date: Jun. 16, 2016

(65) Prior Publication Data
US 2017/0330736 A1 Nov. 16, 2017

(30) Foreign Application Priority Data
Dec. 8, 2014 (EP) .................................. 14196851

(51) Int. Cl.
*H01J 37/34* (2006.01)
*H01J 37/32* (2006.01)

(52) U.S. Cl.
CPC .......... *H01J 37/3405* (2013.01); *H01J 37/32* (2013.01); *H01J 37/32082* (2013.01);
(Continued)

(58) Field of Classification Search
CPC .. H01J 37/32; H01J 37/32082; H01J 37/3405; H01J 37/3435; H01J 37/3444; H01J 37/347
(Continued)

(56) References Cited

U.S. PATENT DOCUMENTS

| 5,096,562 A | 3/1992 | Boozenny et al. |
| 5,200,049 A | 4/1993 | Stevenson et al. |

(Continued)

FOREIGN PATENT DOCUMENTS

| CN | 1183853 A | 6/1998 |
| CN | 1340913 A | 3/2002 |

(Continued)

OTHER PUBLICATIONS

Machine Translation JP 11-006063. (Year: 1999).*
(Continued)

*Primary Examiner* — Rodney G McDonald
(74) *Attorney, Agent, or Firm* — Workman Nydegger

(57) ABSTRACT

A device for use in a sputter system, comprising at least a first end block and a second end block positioned at opposite sides of the sputter system. The device is adapted such that a target assembly comprising at least one target tube or sputter magnetron, when mounted on the first and second end blocks, may be powered actively with RF power at both sides of the assembly, and such that the target assembly, when mounted, is not actively powered continuously with RF power simultaneously at both extremities of a target tube or sputter magnetron. An assembly comprising said device and a control unit for controlling powering of opposite sides of the target assembly by RF power such that the target assembly, when mounted, is not actively powered continuously with RF power simultaneously at both extremities of a target tube or sputter magnetron.

18 Claims, 14 Drawing Sheets

(52) U.S. Cl.
CPC ........ *H01J 37/347* (2013.01); *H01J 37/3435* (2013.01); *H01J 37/3444* (2013.01)

(58) Field of Classification Search
USPC ............. 204/298.08, 298.21, 298.22, 192.12
See application file for complete search history.

(56) References Cited

U.S. PATENT DOCUMENTS

| | | |
|---|---|---|
| 5,589,737 A | 12/1996 | Barnes et al. |
| 5,620,577 A | 4/1997 | Taylor |
| 6,677,828 B1 | 1/2004 | Harnett et al. |
| 2003/0136672 A1 | 7/2003 | Barrett |
| 2005/0106873 A1 | 5/2005 | Hoffman et al. |
| 2013/0008777 A1 | 1/2013 | Choquette et al. |
| 2014/0183037 A1 | 7/2014 | Xie et al. |

FOREIGN PATENT DOCUMENTS

| | | | |
|---|---|---|---|
| CN | 1619767 A | | 5/2005 |
| JP | 11-006063 | * | 1/1999 |
| WO | 2013104925 A2 | | 7/2013 |

OTHER PUBLICATIONS

Extended European Search Report for corresponding European Application No. 14196851.1, dated May 27, 2015.
International Search Report for corresponding International PCT Application No. PCT/EP2015/079040, dated Feb. 18, 2016.
Chinese Office Action from CN Application No. 201580066682.9, dated Sep. 5, 2018.

* cited by examiner

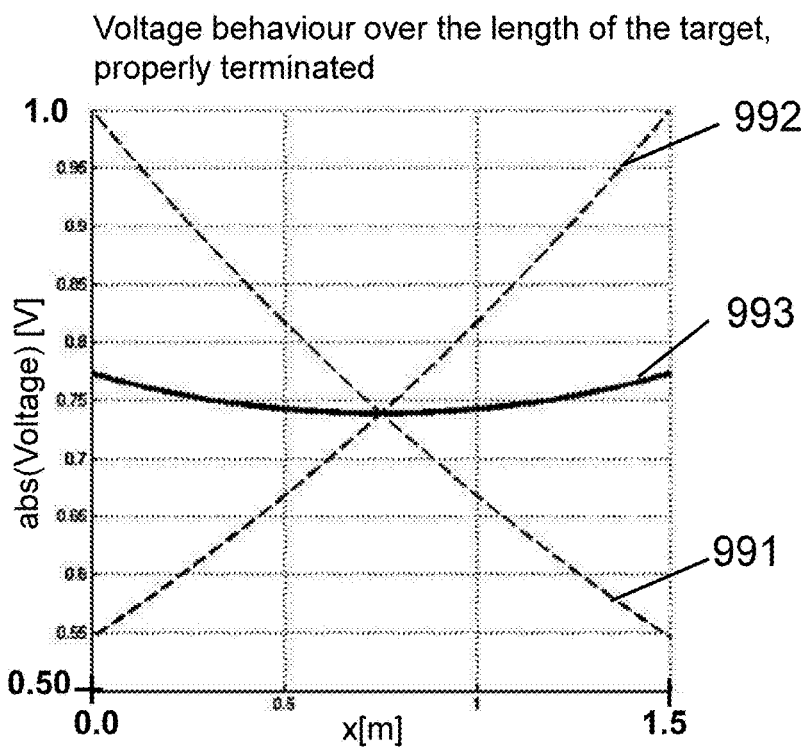
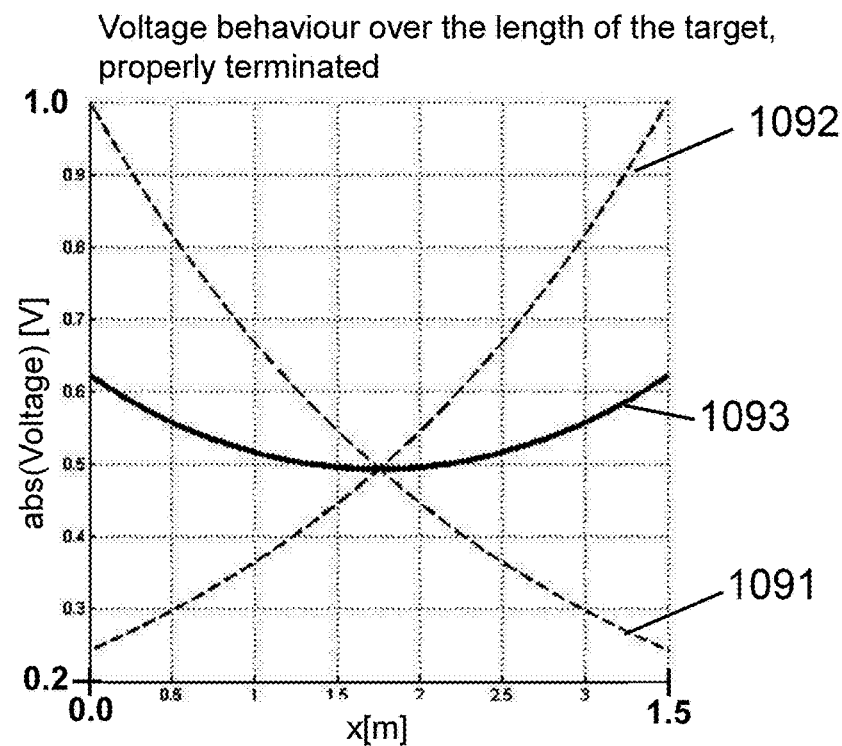

| time period | end block 1 | end block 2 | typ. duty cycle |
|---|---|---|---|
| 2n | RF power | terminated | 50% |
| 2n+1 | terminated | RF power | 50% |

| time period | end block 1 | end block 2 | typ. duty cycle |
|---|---|---|---|
| 3n | RF power | terminated | 45% |
| 3n+1 | terminated | RF power | 45% |
| 3n+2 | RF power | RF power | 10% |

| time period | end block 1 | end block 2 | typ. duty cycle |
|---|---|---|---|
| 4n | RF power | terminated Z1 | 25% |
| 4n+1 | terminated Z1 | RF power | 25% |
| 4n+2 | RF power | terminated Z2 | 25% |
| 4n+3 | terminated Z2 | RF power | 25% |

DEVICE HAVING TWO END BLOCKS, AN ASSEMBLY AND A SPUTTER SYSTEM COMPRISING SAME, AND A METHOD OF PROVIDING RF POWER TO A TARGET ASSEMBLY USING SAID DEVICE OR ASSEMBLY

FIELD OF THE INVENTION

The present invention generally relates to the domain of sputtering. More specifically, the present invention relates to a device for RF sputtering, the device comprising two end blocks. The invention also relates to an assembly comprising such device, and to a sputter system comprising such an assembly, and to a method of RF sputtering using such an assembly.

BACKGROUND OF THE INVENTION

The technique of material deposition by means of sputtering is known already for many decades, and hence need not be explained in detail here. It suffices to say that typically a plasma is generated in a low pressure chamber in which an inert gas such as Argon, or an active gas such as oxygen or nitrogen is present, and that a high voltage is applied between a so called "sputter target" (containing the material to be deposited) and a "substrate" upon which a layer of the sputter material is to be deposited. The Argon atoms are ionized, and the sputter target is bombarded by the Argon ions, so that atoms are freed from the sputter target, and move to the substrate, where they are deposited.

Basically three kinds of sputter targets are being used: planar circular disk targets, planar rectangular targets, and rotational cylindrical targets.

Typically three kinds of power source are being used: DC power, AC power (e.g. at a frequency of 1 to 100 kHz) and RF power (e.g. at a frequency of 0.3 to 100 MHz). DC power is typically used when the sputter target contains an electrically conductive sputter material. AC power is typically used when the deposited layer is less conductive. In the past, when a material with a low conductivity was to be sputtered, one typically added doping atoms to increase the conductivity of the target material.

However, the above-described techniques do not work anymore when an insulating material having a resistivity higher than for example 10 k ohm·cm is to be deposited without being allowed to add dopants, e.g. in applications where even a minor degree of contamination is detrimental for the performance or the lifetime of the deposited layer on the substrate, such as for example electrochromic windows, thin film batteries and solar cell applications, where even minor amounts of conductive particles can cause internal leakage or short-circuiting.

In US2013/0008777A1 Choquette et al. disclose an apparatus for depositing a.o. oxides by using RF power, without the need for metal doping, addressing the contamination issue. Choquette et al. propose a cylindrical rotating sputtering cathode (also referred to as "magnetron") made of a non-magnetic material (such as stainless steel) within which a stationary tubular electrode is inserted, along with magnets attached thereto, as can be seen in FIG. 1 of said publication, replicated herein as FIG. 1. However, when using a sputter target (disk or rectangular or cylindrical) with relatively large dimensions (e.g. 2 to 4 meters, or more) in combination with RF frequencies (e.g. 1 to 100 MHz, or more), standing wave effects (SWE) start playing a role, resulting in a non-uniform electrical field, and hence also in a non-uniform deposited layer. While Choquette et al. address the issue of contamination (by employing RF power in combination with an un-doped sputter material) and the problem of heating (by using a cooling liquid and a non-magnetic material for the electrode and the shaft), the problem of "a standing wave effect" is not mentioned, nor addressed. Choquette seems to concentrate on mechanical issues, rather than electro-magnetic aspects.

US2014/0183037 describes an RF sputtering system 200 (replicated herein as FIG. 2) with a rotary target 201 wherein a single power source 202 and a power splitter 203 is used to apply two (same) RF power fractions at a frequency of 40 MHz to both ends of the metal backing tube of the target. It is alleged that by doing so a voltage node which would otherwise occur at about 1 m distance from the ends, can be removed, and a more uniform electrical field is created. This publication also describes another embodiment (not shown herein) whereby RF power is applied to a single end of the sputter target, while the other end is terminated by a variable terminating impedance. The impedance is varied over time so as to obtain a more uniform electrical field. While the general idea of providing RF power at both ends of a backing tube is described, no specific details are given about how this can be achieved. Hence, there is still room for alternatives and/or for improvement of this system.

SUMMARY OF THE INVENTION

It is an aim of embodiments of the present invention to provide a structure or arrangement or device suitable for applying RF power to a cylindrical sputter target, and to an assembly comprising such a device.

It is an aim of particular embodiments of the present invention to provide such a structure or arrangement or device or assembly whereby a more uniform layer is deposited on a substrate, and/or a more uniform electrical field is created, and/or a more uniform target erosion is obtained, and preferably all of them.

If is also an aim of the present invention to provide a method of providing RF power to a target tube using such an assembly.

This aim is achieved by a device and an assembly and a method according to the present invention.

In a first aspect, the present invention provides a device for use in a sputter system. The device comprises at least a first and a second end block, wherein the first and the second end blocks are positioned at opposite sides of the sputter system. The device is adapted such that a target assembly comprising at least one target tube or sputter magnetron, when mounted on the first and second end blocks, may be actively powered with RF power at both sides of the assembly. The device is furthermore adapted such that the target assembly, when mounted, is not actively powered continuously with an RF power component simultaneously at both extremities of a target tube or sputter magnetron of the target assembly. With "an RF power component" is meant that the power delivered may be pure RF power or power delivered may be a combination of RF with DC, pulsed DC or MF AC.

It is an advantage of using an RF power signal for sputtering (as opposed to DC power or low and mid frequent AC power or pulsed DC power signals) because it allows non-conductive materials to be sputtered, such as e.g. ceramic materials or oxides.

As indicated above, the target assembly comprise at least one target tube or sputter magnetron.

In particular embodiments of the present invention, the target assembly may comprise exactly one target tube or sputter magnetron, in which case this target tube or sputter magnetron is intended to be provided in between the first and the second end blocks. Each of the first and second end blocks is adapted, e.g. by provision of suitable electrical connections, to be connected to an RF power source. The device is furthermore adapted such that the target tube or sputter magnetron, when mounted, is not actively powered with RF power simultaneously at both extremities thereof. This may be obtained for instance, the present invention not being limited thereto, by provision of a switch between the RF power source and the extremities of the target tube or sputter magnetron, such that, at any moment in time, the RF power is only applied to one of the extremities of the target tube or sputter magnetron, while over time the RF power is subsequently applied to both extremities, e.g. alternatingly to the first and the second extremity.

In alternative embodiments of the present invention, the target assembly may comprise a plurality of target tubes or sputter magnetrons; each target tube or sputter magnetron being mounted to one of the end blocks. At least two end blocks are positioned at opposite sides of the sputter system. Each of the end blocks is adapted, e.g. by provision of suitable electrical connections, to be connected to at least an RF power source. This way, different target tubes or sputter magnetrons are powered from opposite sides with respect to the sputter system. The device is furthermore adapted such that the target tube or sputter magnetron, when mounted, is not actively powered with an RF power component simultaneously at both extremities thereof. This can simply be because at the second extremity of each of the target tubes or sputter magnetrons no electrical connections to the RF power supply are provided, or because a controller and associated hardware, e.g. switches, are provided for controlling the system such that this does not happen. At the second extremity, however, an active electrical connection (not illustrated) may be provided for connecting a terminating impedance.

It is an advantage of embodiments of the present invention that the uniformity of the sputtered coating, obtained by using such a device in a sputter system, can be increased by powering the at least one cylindrical target from opposite sides with an RF power component.

In particular embodiments, the present invention provides a device for use in a sputter system, the device comprising: a first end block and a second end block, the first end block and the second end block being oriented towards each other (e.g. having a target fixation flange facing opposite directions) and being positioned at a predefined distance from each other for holding a target assembly, e.g. a cylindrical sputter target tube or a sputter magnetron, therebetween; the first end block having first coupling means for coupling a first end or first side of the sputter magnetron or target tube to an electrical interface of the first end block, this electrical interface being connectable to an RF power source and/or to at least one terminating impedance; the second end block having second coupling means for coupling a second end or second side of the sputter magnetron or target tube, opposite the first end or first side, to an electrical interface of the second end block, this electrical interface being connectable to an RF power source and/or to at least one terminating impedance. The device is adapted such that the sputter target tube or the sputter magnetron, when mounted, is not actively powered simultaneously at both ends or sides of the target tube or sputter magnetron for at least part of, preferably for a major part of, and even more preferred for the whole operating cycle, by an RF power component.

In certain embodiments, the RF power component can be applied directly to the metal backing tube (of the one or more sputter targets), e.g. via a conductive flange and conductive bracket. In other embodiments the RF power component can be applied indirectly to the metal backing tube(s), by applying the RF power component to an inner tubular structure and through cooling liquid. In the first example, said flange and bracket may act as coupling means. In the second example, said tubular magnet holder structure and cooling liquid may act as coupling means.

The first and second end blocks as used in embodiments of the present invention are thus ideally suited for transferring an RF signal to an end of the target tube, or for (directly or indirectly) connecting or coupling an end of the target tube to a terminating impedance.

In an embodiment of the device where the target assembly comprises only a single target tube or sputter magnetron, the electrical interface of the first end block is connectable to a first RF power source and to at least one terminating impedance, and the device is adapted for selectively transferring a first RF power signal originating from said first RF power source to said first end or first side of the sputter magnetron or target tube at a first moment in time, and for electrically terminating said first end or first side of the sputter magnetron or target tube with the at least one terminating impedance at a second moment in time, different from the first moment; and the electrical interface of the second end block is connectable to a second RF power source and to at least one terminating impedance, and wherein the device is adapted for selectively transferring a second RF power signal originating from said second RF power source to said second end or second side of the sputter magnetron or target tube at a third moment in time, and for electrically terminating said second end or second side of the sputter magnetron or target tube with the at least one terminating impedance at a fourth moment in time, different from the third moment.

In alternative embodiments of the present invention where the target assembly comprises at least two target tubes or sputter magnetrons, the electrical interface of the first and second end blocks are connectable to an RF power source, which may be the same RF power source for both end blocks, or which may be different RF power sources. The device is adapted for transferring RF power signals to the first and second end blocks. In these embodiments, the RF power signals may be applied to the first and second end blocks simultaneously, as that does not imply the active powering at two extremities of a single target tube or sputter magnetron. Alternatively, the RF power signals may be applied to the first and second end blocks alternatingly. Preferably, the target tubes or sputter magnetrons are electrically terminated at their extremities opposite to the extremity which is powered by RF power signals.

The expression "connectable to" includes "directly connectable" and "indirectly connectable", for example via a matching network, or via a matching network and a switching unit, or in any other way.

It is an advantage of embodiments of the present invention that it allows an RF power component to be applied to either end or side of a target tube or magnetron while at the same time the opposite end or side of the target tube or magnetron can be connected to a terminating impedance, because in this way a more uniform electrical field and/or a more uniform erosion of the sputter material and/or a more uniform deposition can be obtained, and preferably all of these. With a more uniform erosion, the lifetime of the sputter target tube is increased as compared to prior art devices where RF power is only supplied at a single end of the target tube. This also increases the time between replacements, hence decreases the downtime during which a sputter system cannot be used, and thus also increases the efficiency of a production line.

The electrical interface must be chosen, and the end block must be designed so as to be capable of conducting said RF power signal component, preferably without significant power loss.

The main focus of the present invention is the means and manner in which RF power component can be delivered to the target tube, and the means and manner in which the target tube can be coupled to a terminating impedance. According to embodiment of the present invention this is accomplished by a device or arrangement as described above.

The end blocks may be fixedly or releasably mounted on a mounting surface, for example on a lid or door or wall element of a sputter device, which mounting surface may be part of the device. Releasable mounting facilitates easy replacement of the target tube when a certain amount of sputter material is eroded.

The device may be connectable to only a single terminating impedance, or to a plurality of terminating impedances, one at the time for every target tube or sputter magnetron of the target assembly. The connection is preferably done via automatic switching means, but that is not absolutely required, and the advantageous effects of the present invention may also be obtained by manual connection or switching.

The first RF power supply and the second RF power supply may be one and the same, single RF power supply. The first/second RF power signal may be obtained from the first/second RF power source, or may be derived therefrom, e.g. via an RF splitter or via an impedance. The terminating impedance connectable to the first end of the target tube, may be the same or a different terminating impedance than the one connectable to the second end of the target tube.

The first moment in time may be the same as the fourth moment in time, and the second moment in time may be the same as the third moment in time.

In an embodiment wherein the target assembly comprises only one target tube or sputter magnetron for two end blocks, the device further comprises said sputter target tube or sputter magnetron arranged between said first end block and second end block. In alternative embodiments wherein the target assembly comprises a plurality of target tubes or sputter magnetrons, the device further comprises a first sputter target tube or sputter magnetron mounted on the first end block, and a second sputter target tube or sputter magnetron mounted on the second end block.

Although the target assembly itself is required for operation of the device during actual use, the device as described above is not necessarily produced or sold comprising such a target assembly. In fact, the target assembly typically needs to be replaced many times during the lifetime of the device.

The target assembly may be specifically adapted for use with an RF power component of a predefined frequency. For example, the target assembly may be specifically shaped (e.g. the at least one target tube have a non-constant outer or inner diameter) for creating a more uniform electrical field and/or for causing a more uniform erosion of the sputter material. Or the target assembly may comprise at least one conductive tubular magnet holder bar with an outer diameter of at least 85% the inner diameter of the backing tube, for transferring the RF signal.

In embodiments of the device, the target assembly comprises a sputter target material being an electrically non-conductive material.

The device is particularly suited for sputtering an electrically non-conductive material such as e.g. a ceramic material or an oxide or a carbide or a an organic material or a compound material.

In embodiments of the device, each of the first and second end block is capable of transferring or allowing passage an RF power signal component to the target assembly while the at least one cylindrical sputter target tube or magnetron of this assembly is rotating around its longitudinal axis.

Such an end block may be provided with coupling means having two elements that can rotate relative to each other around a common axis, but remain electrically connected or coupled, (e.g. resistively, capacitively, inductively, or any combination hereof). One of the elements may be stationary, the other element may rotate along with the backing tube. In some specific embodiments, such an end block may be provided with coupling means having a stationary electrical coupling.

In embodiments where the target assembly comprises a single target tube or sputter magnetron, at least one of the first and second end block has rotating means for rotating the cylindrical sputter target tube around its longitudinal axis. In embodiments where the target assembly comprises at least a first and a second target tube or sputter magnetron, both the first and second end blocks, for mounting the first and second target tube or sputter magnetron, respectively, have rotating means for rotating the cylindrical sputter target tubes around their longitudinal axis. Further end blocks, with or without rotating means, may be provided for supporting the other extremity of the first and second target tubes or sputter magnetrons, respectively.

In embodiments of the device, at least one of the first and second end block is adapted for supplying a cooling liquid to said sputter target tube or magnetron, and at least one of the first and second end block is adapted for draining said cooling liquid.

If the RF power is delivered via or through an inner tubular structure, it is advantageous that the outer diameter of said inner tubular structure is at least 85% or at least 90% of the inner diameter of the backing tube of the sputter target, for limiting the power losses through the cooling liquid.

In embodiments of the device, at least one of the first and second end block is adapted for supporting a tubular magnet holder structure within the sputter target tube or magnetron, wherein the tubular magnet holder structure is capable of transferring an RF power signal.

It is an advantage that such a device is ideally suited for holding not only the sputter target tube, for selectively applying an RF power signal component to each of its ends, but also for holding a tubular magnet holder structure. The latter may add several benefits, such as e.g. protection of the magnet against corrosion by the cooling liquid, on-line control of the magnet(s), improved cooling, and in certain embodiments of the present invention, its housing may even be used to transfer the RF power.

Furthermore, although the coupling means may have two elements that can rotate relative to each other, in some embodiments the coupling from one side or from both sides may be static as well. For example, the stationary magnet holder structure may be used at a single side or at both sides for transferring the RF power.

In a second aspect, the present invention provides an assembly comprising a device according to any of the embodiments of the first aspect of the present invention, and a control unit for controlling powering of opposite sides of the target assembly by an RF power component such that the target assembly, when mounted, is not actively powered continuously with an RF power component simultaneously at both extremities of a target tube or sputter magnetron for at least a significant fraction of the operating time. The powering by an RF power component can be controlled to take place alternately at the first and the second extremity of the target assembly, whether the target assembly comprises one or more target tubes or sputter magnetrons; or it can be controlled to take place simultaneously at the first and second end block. The controlling of the powering is such that an RF power component is not simultaneously applied at both extremities of a single sputter target for the majority of the time.

In embodiments of the present invention the control unit comprises a switching unit connectable to the RF power source and to the at least one terminating impedance, the switching unit comprising switching means adapted for selectively connecting the RF power source to the electrical interface of the first end block, and for selectively connecting the RF power source to the electrical interface of the second end block, and for selectively connecting the at least one terminating impedance to the electrical interface of the first end block; and for selectively connecting the at least one terminating impedance to the electrical interface of the second end block. This implementation may in particular be used for embodiments wherein the target assembly comprises a single target tube or sputter magnetron, but is also useful in embodiments wherein the target assembly comprises a plurality of target tubes or sputter magnetrons.

The expression "connectable to" can mean "directly connectable" or "indirectly connectable", for example via a matching network, or in any other way.

It is an advantage of such a switching unit that the electrical interconnection between the (at least one) RF power source and (the at least one) terminating impedance and the one or more target tubes can be dynamically adjusted without having to remove the device from a sputter chamber. This extra degree of freedom can advantageously be used to obtain a more uniform deposition of the sputter material on a substrate. In particular embodiments where the target assembly comprises a single target tube or sputter magnetron, a more uniform electrical field and/or a more uniform erosion of the target material can also be obtained, and preferably all of these.

It is an advantage of using switching means in combination with a plurality of different terminating impedances, that in this way the need for a variable impedance can be avoided, and that a variable impedance can be emulated by coupling to different impedances over time.

In particular embodiments, the at least one RF power source may be adapted for temporarily decreasing its output power during the moment of switching, for avoiding damage to the switches, and/or for increasing the lifetime of the switches. In such embodiments, there may be one or more control lines or a communication bus between the switching unit and the RF power source, for example adapted for indicating moments of switching, and/or for increasing or decreasing or setting the output power.

In particular embodiments, "connecting to said first end of the target tube" may comprise "connecting to an electrical interface of the first end block and connecting or coupling this electrical interface to a first end of the target tube", and "connecting to said second end of the target tube" may comprise "connecting to an electrical interface of the second end block and connecting or coupling this electrical interface to a second end of the target tube".

In embodiments, the assembly further comprising the RF power source, the RF power source being adapted for providing a power signal of 0.5 kWatt to 100 kWatt and having a frequency in the range of 0.3 MHz to 100 MHz. This setup may be used in conjunction with DC power, DC power with superimposed RF being a common technique. This way, RF rich or RF poor signals may be obtained. In such combination cases, the DC may be connected continuously to the target assembly or may be switching synchronized or not synchronized with the RF power.

In embodiments, the assembly further comprises a first matching network arranged between said RF power source and said switching unit.

In embodiments, the assembly further comprises said at least one terminating impedance.

In certain embodiments, the at least one terminating impedance may be a single impedance. In other embodiments, the at least one terminating impedance may be at least two terminating impedances, for example exactly two terminating impedances.

In embodiments, the assembly further comprises means for generating a first power fraction and a second power fraction, and a controller for configuring the switching means in such a way that: the RF power signal component or the first power fraction is applied to the electrical interface of the first end block while the at least one terminating impedance is coupled to the electrical interface of the second end block during a first time fraction of a period; the RF power signal component or the second power fraction is applied to the electrical interface of the second end block while the at least one terminating impedance is coupled to the electrical interface of the first end block during a second time fraction of a period.

It is an advantage if the assembly further comprises a controller for automatically controlling the switching means as indicated. The controller may be a programmable controller or be implemented in programmable logic, or in any other suitable manner. The controller would typically be implemented as part of the switching unit.

The first and second time periods may be sequential, and may have a duty cycle of about 50%, or less than 50% if simultaneous feeding of the target tube from both sides is to be avoided. In such a case, the RF power signal may be alternatingly applied to each end of the target tube, but not continuously simultaneously to both ends. By choosing a suitable switching frequency, despite the fact that during each individual first period and during each individual second period the electrical field is very non-uniform, the time averaged erosion will be quite uniform.

The means for generating the first power fraction resp. the second power fraction may be a first resp. second impedance, for example a first resp. second resistor.

In embodiments, the assembly further comprises an RF power splitter for generating a first power fraction and a second power fraction, and a controller for configuring the switching means in such a way that: the RF power signal component or the first power fraction is applied to the electrical interface of the first end block, while the at least one terminating impedance is coupled to the electrical interface of the second end block during a first time fraction of a period; the RF power signal component or the second power fraction is applied to the electrical interface of the second end block, while the at least one terminating impedance is coupled to the electrical interface of the first end block during a second time fraction of a period; the first power fraction is applied to the electrical interface of the first end block and the second power fraction is applied to the electrical interface of the second end block during a third time fraction of a period. Hence during the third fraction both end blocks are powered simultaneously with an RF power component, though possibly with a different power fraction.

It is an advantage of using an RF power splitter in that it allows an RF power component to be applied to both ends of the target assembly simultaneously, which is in particular useful in embodiments where the target assembly comprises a plurality of target tubes or magnetrons.

It is an advantage of using an RF power splitter for generating two power fractions rather than using two separate RF power supplies, because it allows to provide two RF power signals which are in phase, and that one RF power source can be omitted, which is a considerable cost saving.

It is pointed out that the simultaneous application of an RF power component to both ends of the target tube is not mandatory for the present invention, but purely optional. It is particularly useful in embodiments where the target assembly comprises a plurality of target tubes or magnetrons. Powering a same target at both ends with an RF component for some fraction of time may be beneficial in some cases where that specific uniformity profile may contribute to the overall uniformity profile of all time fractions combined.

In a third aspect, the present invention provides a method of providing an RF power component to a target assembly comprising at least one target tube or sputter magnetron mounted on at least a first and a second end block positioned at opposite sides of the sputter system. The method comprises powering opposite sides of the target assembly by an RF power component such that the target assembly is actively powered with an RF power component at both sides of the assembly, and such that the target assembly is not actively powered continuously with an RF power component simultaneously at both extremities of a target tube or sputter magnetron.

In particular embodiments, the present invention provides a method of providing an RF power component to a target assembly using the assembly according to embodiments of the second aspect, the method comprising the steps of: connecting a first port of the switching unit to an output of an RF power source for receiving an RF power signal component; connecting a second port of the switching unit to at least one terminating impedance; configuring the switching means for selectively transferring the RF power signal component or a first fraction thereof to a third port of the switching means connectable to the electrical interface of the first end block, and/or configuring the switching means for selectively transferring the RF power signal component or a second fraction thereof to a fourth port of the switching means connectable to the electrical interface of the second end block, and/or configuring the switching means for selectively coupling the at least one terminating impedance to said third port of the switching means, and/or configuring the switching means for selectively coupling the at least one terminating impedance to said fourth port of the switching means.

This method includes the possibility to simultaneously apply an RF power component to both ends of the target assembly, but that is not absolutely required, and it is also possible to apply an RF power component to either end or side of the target assembly at different moments in time without ever applying an RF power component to both ends or both sides simultaneously.

In embodiments, the method comprises the steps of: configuring the switching means for transferring the RF power signal component or a first fraction thereof to the electrical interface of the first end block while coupling the at least one terminating impedance to the electrical interface of the second end block during a first time fraction of a period; and configuring the switching means for transferring the RF power signal component or a second fraction thereof to the electrical interface of the second end block while coupling the at least one terminating impedance to the electrical interface of the first end block during a second time fraction of a period.

In embodiments, the scheduler of the controller may be designed to generate only first and second time periods. Preferably the duty cycle of the first and second time periods is 50% each, but that is not absolutely required, and a duty cycle ratio of e.g. 30% for the first fraction of a periods and 70% for the second fraction of a periods for example, would also work. In this schedule there are no time slots where an RF power component is applied to both ends or to both sides of the target assembly simultaneously.

In embodiments of the method, the switching unit further comprises an RF power splitter for providing a first power fraction and a second power fraction, and the method comprises the steps of: configuring the switching means for applying the RF power signal component or the first power fraction to the electrical interface of the first end block while coupling the at least one terminating impedance to the electrical interface of the second end block during a first time fraction of a period; and configuring the switching means for applying the RF power signal component or the second power fraction to the electrical interface of the second end block while coupling the at least one terminating impedance to the electrical interface of the first end block during a second time fraction of a period; and configuring the switching means for simultaneously applying the first power fraction to the electrical interface of the first end block and for applying the second power fraction to the electrical interface of the second end block during a third time fraction of a period.

BRIEF DESCRIPTION OF THE DRAWINGS

FIG. 9 is a graphical representation of a simulated voltage behavior (time averaged absolute value of the voltage amplitude) over the length of a properly terminated sputter target having a length of 1.5 m, obtainable by embodiments of the present invention, whereby an RF power signal of 13.56 MHz is alternatingly applied to one end of the cylindrical sputter target while at the same time the opposite end is terminated via an impedance, and vice versa, resulting in a substantially uniform voltage pattern.

FIG. 10 is a similar graph as that of FIG. 9 for a sputter target having a length of 3.5 m.

Figure 1:
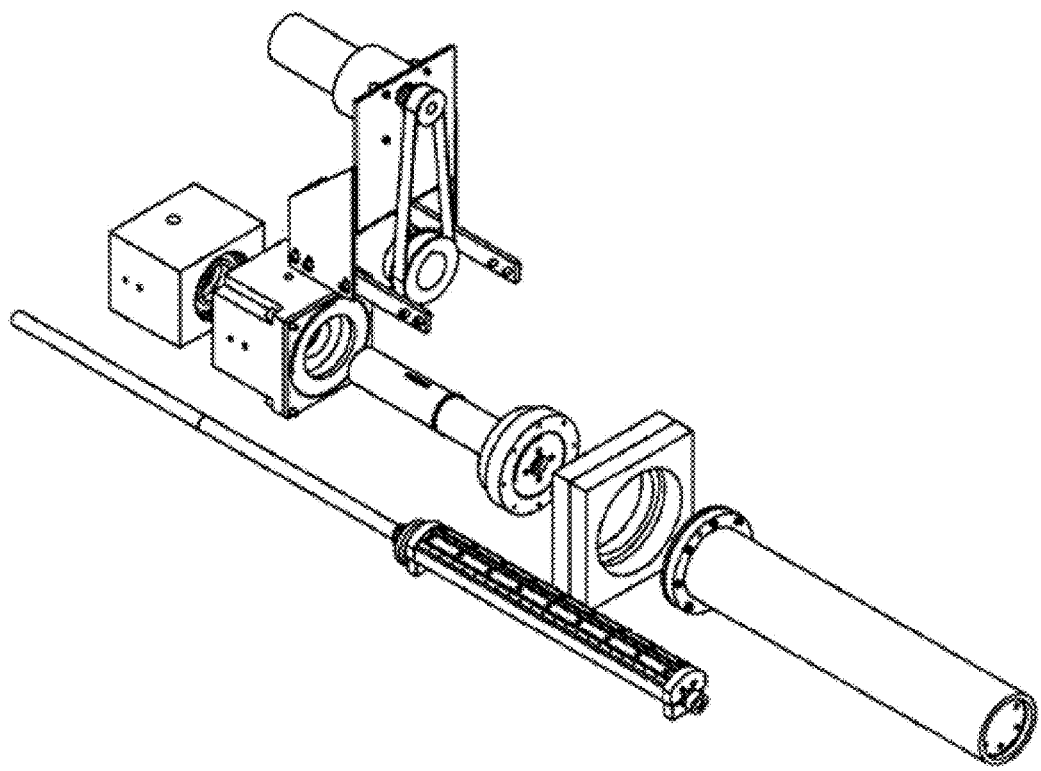
FIG. 1 shows (in exploded view) a sputter device known in the art, whereby a stationary tubular electrode is inserted at one end of the rotatable backing tube of a cylindrical sputter target, and whereby an RF signal is applied to one side of the electrode.

It is noted that the direction of arrows in the drawings should not be interpreted as the actual direction in which current flows, but is used merely for the sake of explanation.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in the present invention reference is made to an "RF signal", a signal having a frequency in the range of 0.3 MHz to 100 MHz is meant. With "an RF power component" is meant that the power delivered may be pure RF power or that, alternatively, power delivered may be a combination of RF with DC, pulsed DC or MF AC. In the following detailed description, if reference is made to "RF power", such "RF power component", which may be combined with non-RF electrical signals, is intended to be included.

Where in the present invention reference is made to an "end-block", reference is made to an element or component which is located at an end of a backing tube, and is adapted for holding the backing tube, and for rotating it around its longitudinal axis, but an end block may also have other functions, such as e.g. cooling.

Before describing the present invention, the next few paragraphs will first explain in more detail what an "end block" is.

Large coaters to coat e.g. glass with all kinds of stacks of functional coatings are often equipped with rotating tubular sputtering targets. The target itself is rotating relative to the sputtering system and hence a complex and space occupying 'end-block' is needed to bear, rotate, energize, cool and isolate (coolant, air and electricity) the rotating target while holding the magnet array fixed inside. Several arrangements exist in the art, for example:

"Double right-angled end-blocks" such as e.g. disclosed in U.S. Pat. No. 5,096,562 (FIG. 2, FIG. 6 thereof) and US 2003/0136672 A1 wherein the means for bearing, rotating, energizing, cooling and isolation (air, coolant and electrical) are divided between two blocks, situated at either end of the target. With right-angled is meant that the end-blocks are mounted to the wall that is parallel to the rotation axis of the target.

"Single, straight-through end-blocks" such as e.g. disclosed in U.S. Pat. No. 5,200,049 (FIG. 1 thereof) wherein the means for bearing, rotating, energizing, cooling and isolation are all incorporated in one end-block and the target is held cantilevered inside the large area coater. With 'straight-through' is meant that the rotation axis of the target is perpendicular to the wall on which the end-block is mounted. 'Semi-cantilevered' arrangements are also described (U.S. Pat. No. 5,620,577) in that the end of the target opposite from the end-block is held by a mechanical support An end-block links the sputtering target in the sputtering system to the outside of the sputtering system. Such an end-block is typically mountable as a single unit on a sputtering system, although a wall integrated end-block could be envisaged as well. Within part of an end-block the pressure may be higher than in the sputtering system, preferably the pressure inside is close to atmospheric. Means that are removable with the target tube or the removable magnet bar assembly are typically not considered as belonging to the end-block. The primary function of the end-block is to carry and to revolve the target around an axis of rotation. As sputtering is performed under a low gas pressure, the end-block must be gas tight at all times, also during rotation. As the sputtering of the target may generate a lot of heat on the target surface, the target has to be cooled, which is normally done with water or another suitable coolant. This coolant may be fed and evacuated through the end-block. The target may also be fed with an electrical current in order to maintain the target at a certain electrical potential. In order to incorporate any or all these functions, each end-block may comprise one or more of the following means: (i) drive means to make the target rotate, (ii) a rotatable electrical contact means to provide electrical current to the target, (iii) one or more bearing means to mechanically support the target while allowing rotation around its axis, (iv) one or more rotatable coolant sealing means, (v) one or more rotatable vacuum sealing means, (vi) means for holding the magnets or magnetic array.

If two end blocks are present, they may, but need not have the same functions. For example, it suffices that only one of them has drive means for rotating the target.

In the context of the present invention, a device with at least two end blocks is provided, wherein the at least two end blocks are positioned at opposite sides of a sputter system. The at least two end blocks may be mounted in the sputter system such that a single target tube or sputter magnetron can be mounted between them, or the at least two end blocks may be mounted in the sputter system such that at least two target tubes or sputter magnetrons can be mounted, each on another one of the end blocks. The at least a first and second end block are specifically adapted for allowing an RF power signal to be applied to one end, or to each end individually, or to both ends simultaneously of a target assembly, for instance to one end, or to each end individually of a sputter target tube, and for connecting one end, or each end individually, or both ends simultaneously of a target assembly, for instance one end, or each end individually of a sputter target tube to a terminating impedance, as will be described in more detail below. One, two or more of the end blocks may optionally also provide other functions such as e.g. rotating the tube around its longitudinal axis, and/or providing DC power, and/or cooling by means of a cooling liquid, and/or supporting a magnetic structure within the rotating tube, while maintaining the necessary vacuum integrity.

Where in the present invention reference is made to "applying an RF signal to a magnetron", what is meant is that an RF signal is applied to at least one of the following components: target tube, backing tube, inner tube, magnet bar holder, or cooling water in the target.

Where in the present invention, reference is made to "input" or "output", this should not be interpreted too strictly as indicating the direction in which the current flows, (which actually may be bi-directional for an AC or RF current), but is to be interpreted as "port" or "terminal". For example, the "first port" of the switching unit is also referred to herein as "first input of the switching unit", the second port is also referred to herein as "second input", the third port is also referred to herein as "first output", and the fourth port is also referred to herein as "second output", for ease of explanation, but this is mere convention.

Figure 2:
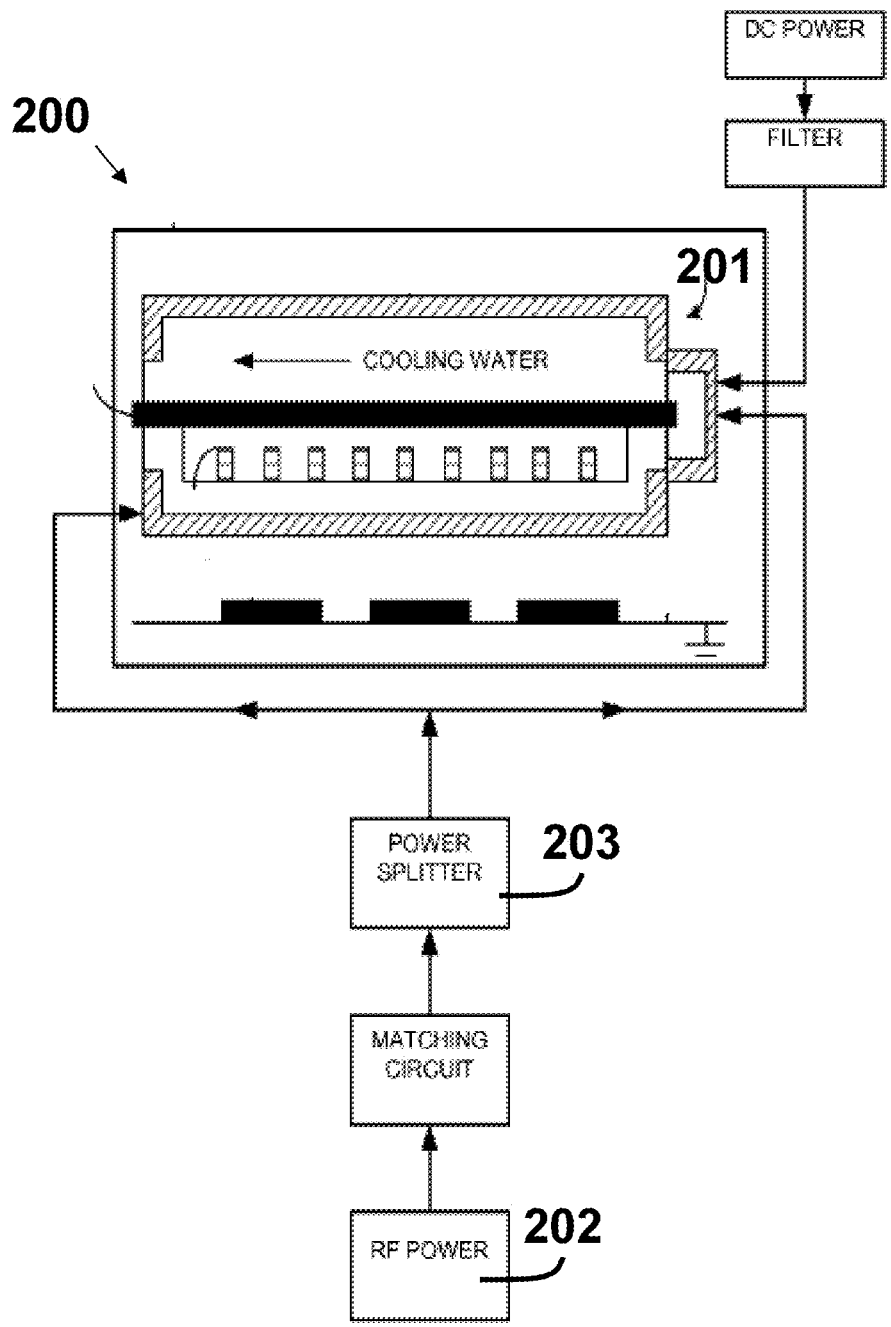
FIG. 2 is a schematic representation of a rotatable cylindrical sputter target known in the art, whereby an RF power signal is simultaneously applied at both ends of the backing tube.

FIG. 1 and FIG. 2 were already discussed in the background section.

Figure 3:
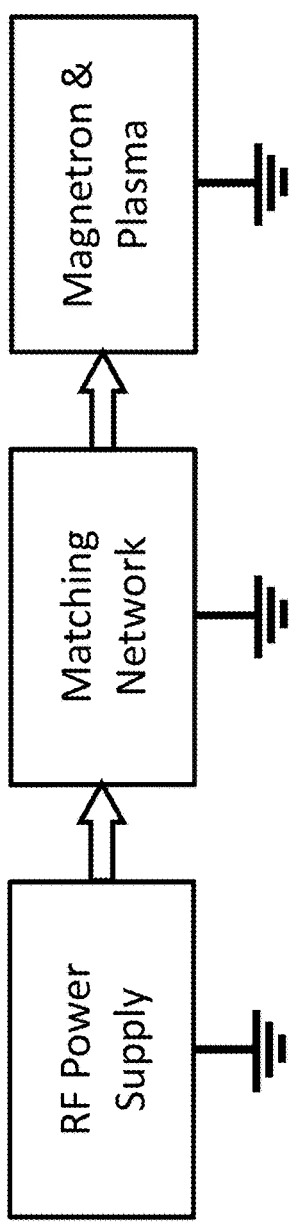
FIG. 3 is a block-diagram representation of the configuration of FIG. 1.

FIG. 3 is a block-diagram representation of the configuration of FIG. 1, but also for other RF sputter target configurations, such as for example a sputter configuration with a planar disk target powered by a single RF feed located in the centre of the disk. The purpose of this abstract representation is to clearly identify the differences with the present invention. In particular, in this block diagram RF power is applied to the sputter target at a single location only, and the sputter target is not terminated by a terminating impedance.

Figure 4:
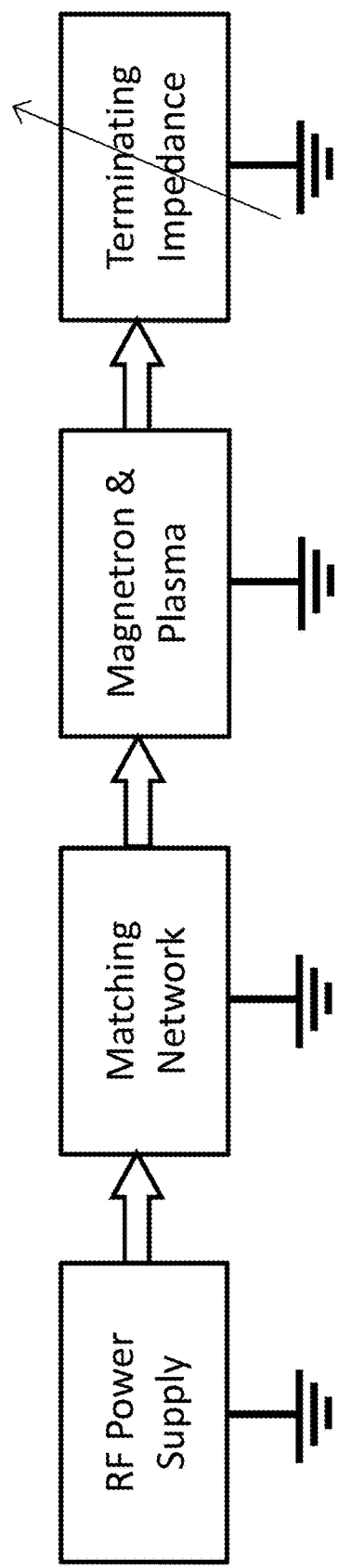
FIG. 4 is a block-diagram representation of the embodiment described in US2014/0183037 whereby a cylindrical sputter target is powered by an RF power signal from one end, while the other end is connected to a variable terminating impedance.

FIG. 4 is a block-diagram representation of the embodiment described in US2014/0183037 whereby a cylindrical sputter target is powered by an RF power signal from one end, while the other end is connected to a terminating impedance, the value of which is varied over time. It is alleged in said publication that by suitable varying the terminating impedance, a more uniform erosion of the target material is obtained.

Figure 5:
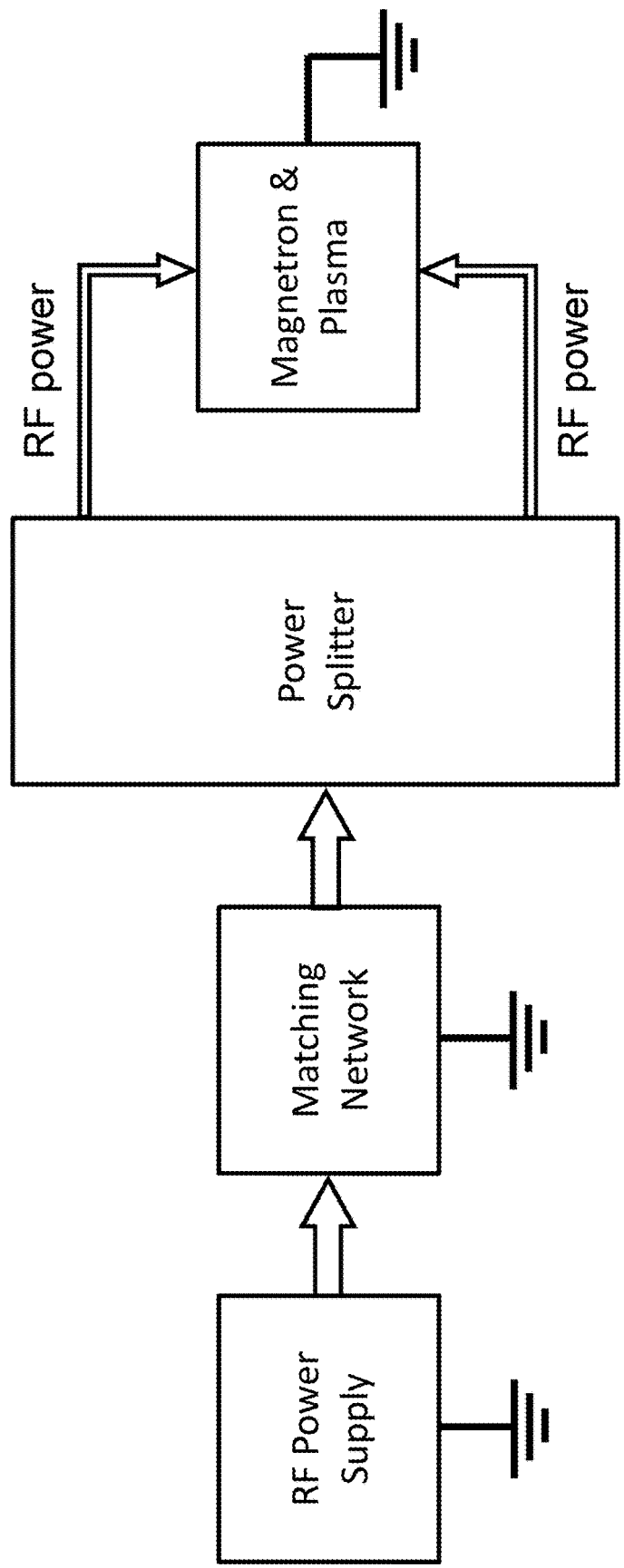
FIG. 5 is a block-diagram representation of the prior art embodiment shown in FIG. 2, whereby two equal RF power fractions are simultaneously applied to both ends of a sputter target.

FIG. 5 is a block-diagram representation of the embodiment shown in FIG. 2, whereby a cylindrical sputter target (or magnetron) is powered simultaneously from both ends thereof by two RF power signals generated by a single RF power source and an RF power splitter.

FIG. 6(a) is a block-diagram representation of embodiments according to the present invention, showing a system 600 comprising two end blocks and a single sputter target or magnetron, wherein the system 600 is adapted for applying a single RF power signal to a first end or side of a cylindrical sputter target or magnetron while at the same time the second, opposite end or side of the sputter target or magnetron is connected or coupled to a terminating impedance 695 in a first mode of operation (e.g. during a first period of time), and adapted for applying a single RF power signal to the second end or side of the cylindrical sputter target or magnetron while at the same time the first, opposite end or side of the sputter target or magnetron is connected or coupled to a terminating impedance 695 in a second mode of operation (e.g. during a second period of time, different from the first period of time).

This behavior can for example be obtained by using a switching unit 680. The basic functionality of the switching unit 680 is shown in FIG. 6(b) and FIG. 6(c). This can easily be accomplished by circuits known in the prior art, e.g. using power switches, and hence need not be further explained here. The switching means may comprise a controller, for example programmable logic or a programmable microcontroller programmed for controlling the power switches (not shown) so as to obtain the interconnections shown in FIG. 6(b) and FIG. 6(c), but other modes are also possible, for example as shown in FIG. 6(d), e.g. in case the switching unit 680 further comprises a power splitter 681.

The switching unit 680 preferably comprising first switching means (not shown) adapted for selectively connecting or coupling the RF power source 697 to the electrical interface 661 of the first end block 631 and/or to the electrical interface 662 of the second end block 632, and second switching means (not shown) for selectively coupling the terminating impedance 695 to the electrical interface 661 of the first end block 631 and/or to the electrical interface 662 of the second end block 632. The first and second switching means may be any suitable switching means for switching RF power, known in the art, for example in the field of power electronics.

While the RF frequency is a high frequency, e.g. about 13.56 MHz or about 40 MHz, the switching frequency of the switching unit 680 is typically much lower, e.g. a frequency in the range of 0.01 Hz to about 100 kHz, e.g. in the range of 0.1 Hz to 10 kHz, e.g. in the range of 1 Hz to 1000 Hz. If the switching frequency is too low with respect to the speed at which a substrate moves through the sputter chamber, the uniformity of the deposited layer on the substrate may degrade. If the switching frequency is too high, the lifetime of the switching means, e.g. of the power switches may be reduced, and the risk of a production stop is increased. And in a case where the power of the RF power source is temporarily reduced or even switched off during the switching, the average power is reduced if the switching frequency increased (assuming a given maximum RF power). In order to obtain a more uniform erosion of the sputter material over the circumference of the cylindrical sputter target, the switching frequency may e.g. be chosen much larger than the rotational frequency of the sputter target, or may be chosen asynchronous or otherwise unrelated from said rotational frequency. The skilled person can find a suitable trade-off by taking these and other considerations into account.

In some embodiments, the switching frequency may be up to 100 kHz for an RF frequency in the range of 0.3 to 100 MHz. In particular embodiments, the switching frequency may even be in the same order of magnitude as the RF frequency, for example a switching frequency of about 1.00 MHz or about 3.39 MHz or even 13.56 MHz for an RF frequency of 13.56 MHz. Furthermore, the frequencies of the RF source and switching unit may be independent, being an exact multiple, possibly but not necessarily being synchronized in phase or with a specific phase shifted.

Alternatively, in some embodiments the switching unit 680 may be connected to a primary power source having a frequency lower than the typical RF values as suggested before (i.e. lower than 0.3 MHz). In particular embodiments, the primary power supply that is connected to the switching unit 680 may be for example a typical AC or DC power supply and as such replacing the RF power source 697.

The switching unit 680 may optionally further comprise a power splitter 681 for generating a first and a second power fraction, and means for simultaneously applying the first power fraction to the first end block 631 and the second power fraction to the second end block 632 during a certain time period, as schematically indicated by the block diagram of FIG. 6(d).

Some examples of temporal behavior of the switching unit 680 will be described in relation to FIG. 11(b) to FIG. 11(d), but the invention is not limited thereto, and other switching schemes can also be used, for example asynchronous switching schemes, or pseudo-random switching schemes.

Figure 6:
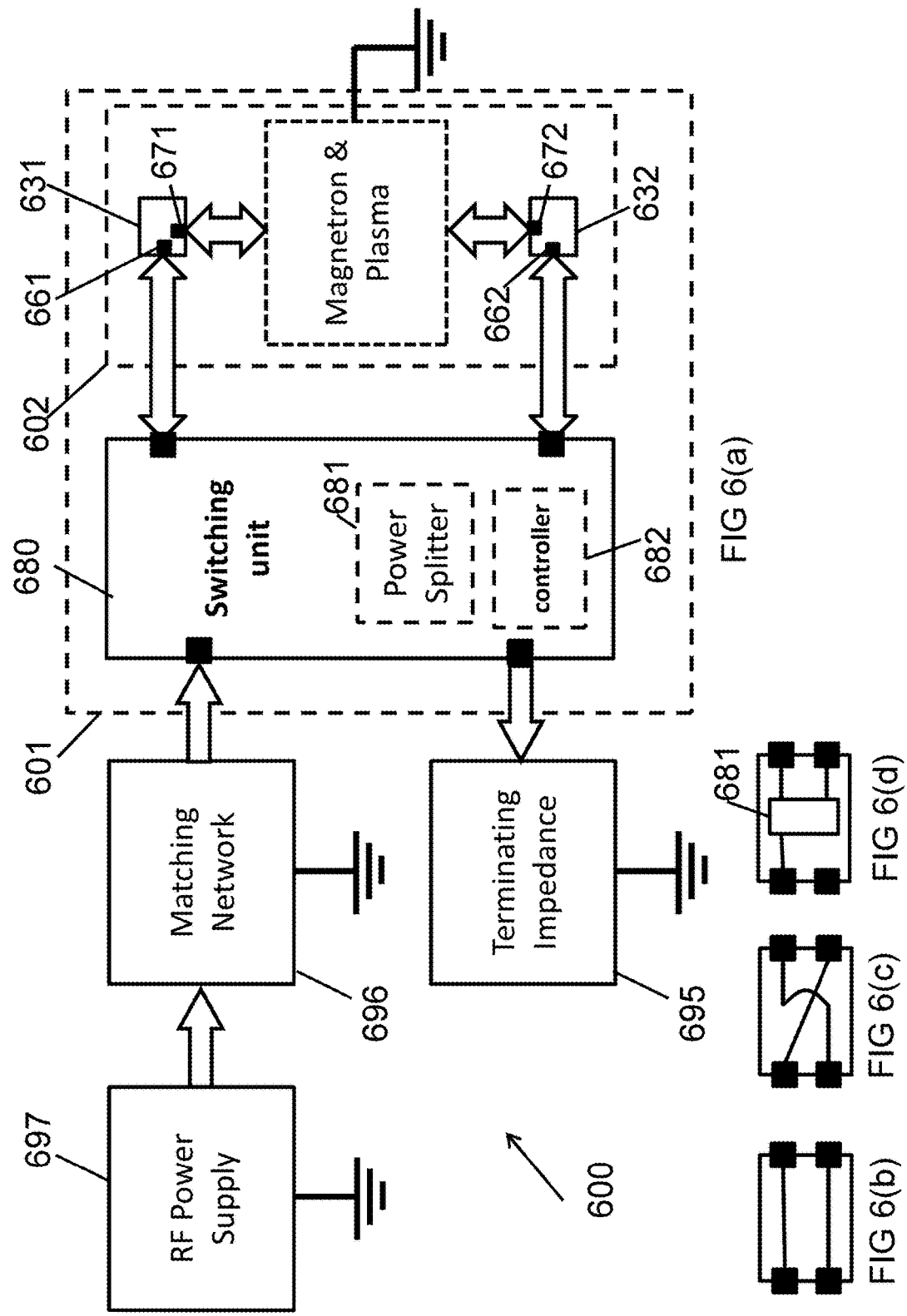
FIG. 6(a) is a block-diagram representation of embodiments according to the present invention, showing a system capable of applying a single RF power signal to a first end of a cylindrical sputter target while at the same time coupling or connecting the second, opposite end of the sputter target to a terminating impedance during a first period of time, and capable of applying the single RF power signal to the second end of the cylindrical sputter target while at the same time coupling the first, opposite end of the sputter target to a terminating impedance during a second period of time. Optionally the system may also be adapted for simultaneous applying two RF power signals derived from the RF power supply to the sputter target tube, at the first end and at the second end thereof.
FIG. 6(b) to (d) illustrates several possible switching configurations for interconnecting said RF power source and said terminating impedance with the first and second end of the target tube.

In the system shown in FIG. 6, the electric or magnetic or electro-magnetic coupling or connection between the first resp. second end of the target tube and the RF power source 697 and/or the terminating impedance 695 is achieved via the first and second end block 631, 632, schematically represented by rectangles in the block-diagram of FIG. 6(a). Some specific implementations will be described in relation to FIG. 14 to FIG. 17. Relevant for the present invention is that the first end block 631 has an electrical interface 661 which can e.g. be connected to an RF power source 697 or to a terminating impedance 695 (e.g. via a switching unit 680 and/or a matching network 696, or in any other way). The first end block 631 also has coupling means 671 for electrically or magnetically or electro-magnetic coupling said electrical interface of the first end block with the first end or side of the target tube or magnetron, for example to a magnet bar holder. In this way an RF power signal can be transferred to the first end or side of the target tube or magnetron at one moment in time, and said first end or side of the target tube or magnetron can be connected to a terminating impedance at another moment in time. Likewise the second end block 632 has an electrical interface 662 for coupling or interconnection with the RF power source (directly or indirectly) and/or the terminating impedance 695, and coupling means 672 for coupling or interconnection with the second end or side of the target tube or magnetron.

The coupling 671, 672 may for example be purely resistive, or purely inductive, or purely capacitive, or a combination of resistive and capacitive, or a combination of resistive and inductive, or a combination of capacitive and inductive, or a combination of restive and capacitive and inductive. The coupling will be preferably rotatable, however may be stationary in some embodiments. Typically the cylindrical sputter target rotates around its longitudinal axis. Resistive couplings between two elements that rotate with respect to each other are known in the art, for example electrical brushes known for example from the field of DC motors with brushes, but of course the invention is not limited thereto, and other resistive couplings are also possible, e.g. via a conductive liquid.

Figure 12A:
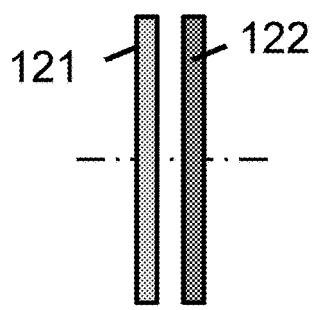
FIG. 12(a) to (c) show three examples of capacitive coupling between two elements which are rotatable with respect to each other around an axis, as can be used in a device according to the present invention.
Figure 12B:
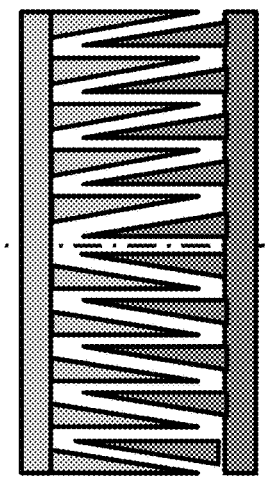
Figure 12C:
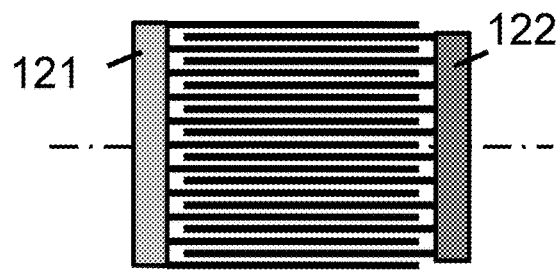
Figure 13A:
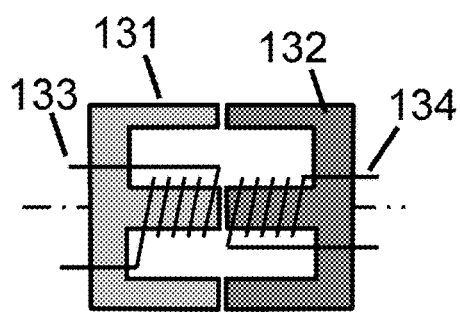
FIG. 13(a) to (b) show two examples of inductive coupling between two elements which are rotatable with respect to each other around an axis, as can be used in a device according to the present invention.
Figure 13B:
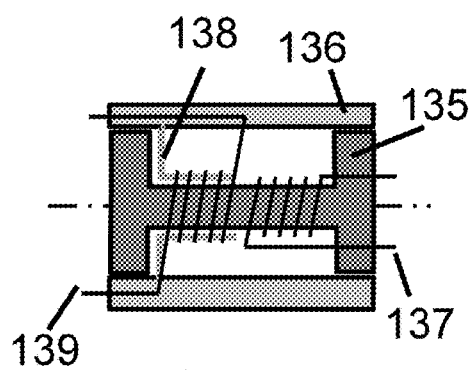

Some examples of capacitive coupling between two elements that are rotatable with respect to each other are shown in FIG. 12(a) to FIG. 12(c), but the invention is not limited to these examples, and other capacitive couplings are also possible. Some examples of inductive couplings between two elements that are rotatable with respect to each other are shown in FIG. 13(a) to FIG. 13(b), but the invention is not limited to these examples, and other inductive couplings are also possible.

The remaining parts of the system 600, i.e. the RF power source 697, the matching network 696 and the terminating impedance 695 are known in the art, and hence need not be further explained here.

In variants of the system 600 (not shown), the system may comprise at least two RF power sources 697, for example two RF power sources. These RF power sources may have the same or different frequencies and may operate at the same or different power levels. Each RF power source may have its own matching network 696. The switching unit 680 of such a system may have one terminal (or port) for each RF power source.

In these or other variants of the system (not shown), the system may comprise at least two terminating impedances 695, for example at least three different terminating impedances, each having a different electrical impedance. By powering one end of the target tube with an RF power signal, and by sequentially applying each of the plurality of terminating impedances to the opposite end of the sputter target, a variable termination of the sputter target can be emulated, even though each of the impedances are actually fixed impedances. The skilled person may select a suitable number and proper values of the terminating impedances 695 so as to obtain a more uniform voltage profile, and/or a more uniform erosion of the sputter material, and/or a more uniform deposition of the sputter material on a substrate.

In these or other variants of the system of FIG. 6, the switching unit 680 may have three "inputs" (or terminals), one for connecting an RF power supply, one for connecting a DC power supply, and one for connecting a terminating impedance, and the switching unit 680 may be adapted for connecting or coupling one of these inputs to the first end or side of the sputter target or magnetron, while connecting or coupling one of the remaining two inputs to the second end or side of the sputter target or magnetron.

FIG. 6(a) may represent yet another variant of the system 600, where an RF power signal is provided to one or to either end or side of a sputter magnetron or sputter target, via an electrical interface 661, 662 of the first resp. second endblock 631, 632, and via 671, 672 connected to a stationary inner tube, which may be part of, or an extension of a magnet bar holder structure 614. In this embodiment, the end blocks 631, 632 may be preferably electrically insulated from said inner tube, for allowing passage of the RF signal. How the electrical coupling between this inner tube and the backing tube can occur, will be further discussed in relation to FIG. 16 and FIG. 17.

Figure 7:
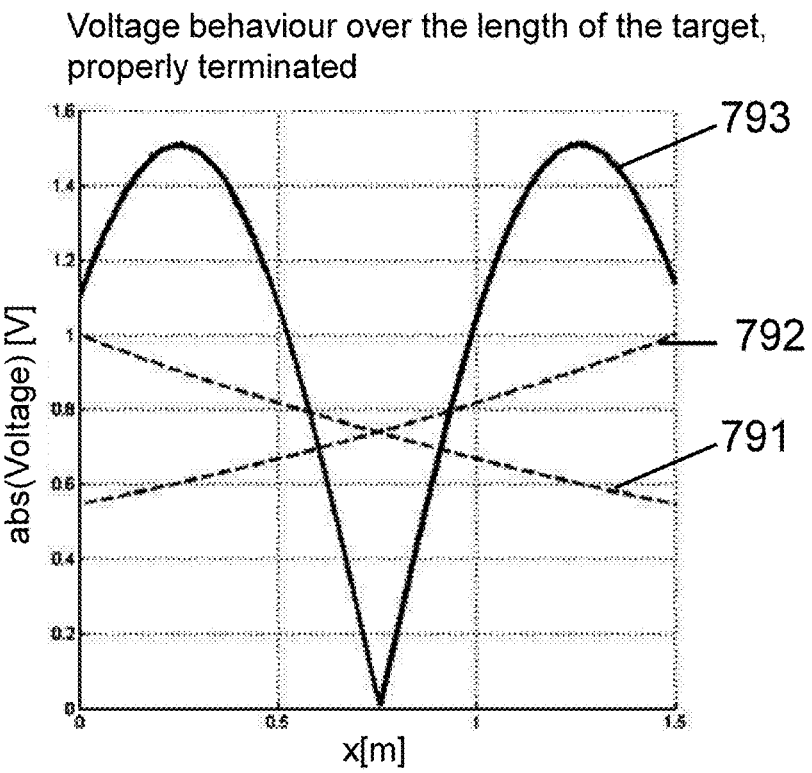
FIG. 7 is a graphical representation of a simulated voltage behavior (time averaged absolute value of the voltage amplitude) over the length of a properly terminated sputter target having a length of 1.5 m, when simultaneously being powered from both ends by the same RF power signal of 13.56 MHz (e.g. coming from an RF power splitter), resulting in a standing wave pattern having a voltage node in the middle.

In FIG. 7 curve 793 is a graphical representation of a simulated voltage behavior (time averaged absolute value of the voltage amplitude) over the length of a single properly terminated sputter target having a length of 1.5 m, when simultaneously being powered from both ends by two same RF power signals of 13.56 MHz coming from an RF power splitter, resulting in a standing wave pattern having a voltage node in the middle. With "properly terminated" is meant that the target is connected to an impedance whose value is equal to the characteristic impedance of the target, so that no reflection of waves occurs. The dotted curve 791 represents the voltage waveform (envelope of the voltage signal) that would occur when the RF power signal is applied only at the first end of the sputter target while the second end is terminated with a terminating impedance. As can be seen, the amplitude decreases towards the second end, and the waveform is very non-uniform. Likewise, the dotted curve 792 represents the envelope of the voltage waveform that would occur when a single RF power signal is applied at the second end of the target tube, while the first end is terminated with a terminating impedance, resulting in a mirrored version of the waveform 791.

The inventors have noticed that the expected voltage envelope curves as described in the present invention do not fully correspond to the findings of the prior art (in particular FIG. 3 of US2014/0183037). In particular, simultaneously applying the RF power at both ends does not seem to provide a very uniform voltage waveform, but a standing waveform 793 with a voltage node in the middle. Furthermore, the wavelengths as depicted in the prior art appear to be much larger than those shown in FIG. 7 and FIG. 8 of the present invention. This is even more surprising since the prior art uses an RF frequency of 40 MHz, while the graphs of the present invention are simulated for 13.56 MHz. The origin of this difference might be found in the value of the specific impedance that has been assumed for simulating the target and plasma. Similar graphs as those shown in FIG. 7 will be obtained when an RF-frequency other than 13.56 MHz is used.

Figure 8:
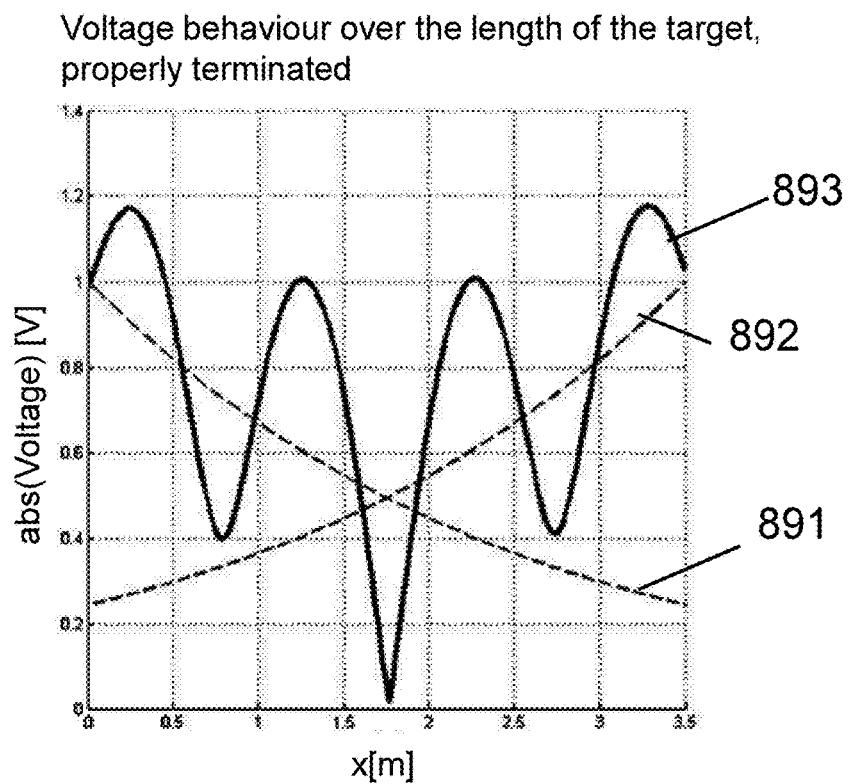
FIG. 8 is a similar graph as that of FIG. 7 for a sputter target having a length of 3.5 m.

FIG. 8 shows similar graphs for a sputter target having a length of 3.5 m. Curve 893 shows the voltage behavior over the length of the sputter target when RF power signals are simultaneously applied to both ends of the target tube, curve 891 shows the voltage behavior when the RF power signal is applied only to the first end while the second end is terminated by a suitable impedance, and curve 892 shows the voltage behavior when the RF power signal is applied only to the second end while the first end is terminated by a suitable impedance. As can be seen, simultaneously applying the RF power at both ends does not seem to provide a very uniform voltage waveform, but has a voltage node in the middle of the target.

Referring now to FIG. 9, curve 991 and 992 is identical to curve 791 and 792 respectively of FIG. 7 (but shown on a different scale). The inventors have surprisingly found that, when the two RF power signals are not simultaneously applied continuously to both ends of the single sputter target (as shown in FIG. 2), but alternatingly in even time slots only to the first end while the second end is terminated, and in odd time slots only to the second end while the first end is terminated, (assuming that the odd and even time slots have the same duration), then the rather uniform result shown by curve 993 is obtained. Such a voltage waveform will likely result in a substantially uniform erosion of the sputter material over the entire length of the target tube (e.g. with thickness variations of the sputter material less than about 15%), and in a substantially uniform deposition of sputter material on a substrate (e.g. with thickness variations less than about 15%).

FIG. 10 shows similar graphs as FIG. 9 for a sputter target having a length of 3.5 m. Curve 1091 and 1092 are identical to curve 891 and 892 respectively, and curve 1093 shows the voltage behavior over the length of the target when the RF power is alternatingly applied to either side of the single target tube, while the opposite side of the target tube is terminated by a suitable impedance, and using a duty cycle ratio of 50% for the odd and even time slots. As can be seen, a very uniform result shown by curve 1093 is obtained. Such a voltage waveform will likely result in a substantially uniform erosion of the sputter material over the entire length of the target tube (e.g. with thickness variations of the sputter material less than about 30%), and in a substantially uniform deposition of sputter material on a substrate (e.g. with thickness variations less than about 30%).

It is noted that the curves shown in FIG. 7 to FIG. 10 are based on simulations, and on assumptions of operating conditions (e.g. temperature, pressure), and characteristics of the plasma etc. These values may not correspond exactly to reality, and the real curves can only be obtained by measurements. Therefore the inventors do not wish to be bound to these particular curves or values, but only to the underlying principles of the present invention.

FIG. 11(*a*) is an example of a device 1102 having two end blocks 1131, 1132 and a target assembly comprising a single target tube or sputter magnetron mounted between the two end blocks 1131, 1132, as can be used in the system 600 shown in FIG. 6. FIG. 11(*a*) is a less abstract representation of a device 1100 than was shown in FIG. 6(*a*). In particular embodiments of the present invention, the device 1102 comprises two end blocks 1131, 1132 arranged in line with each other, and at a distance from each other, and being oriented towards each other, e.g. having a target fixation flange facing opposite directions, so that a target tube 1170 can be mounted therebetween.

The target tube 1170 itself is an optional part of "the device", in the sense that the device 1102 may be produced and sold without the target tube 1170 included. Of course the target tube 1170 is required during actual use of the device 1102 in a sputter system, but an underlying idea of the present invention lies in the configuration or arrangement of the end blocks 1131, 1132, and the fact that the end blocks are adapted for transferring RF power via electrical interfaces, e.g. electrical connections 1161, 1162 to the sputter target, and for connecting or coupling (at another moment in time) said ends of the target tube to a terminating impedance via the same electrical interface 1161, 1162.

As described above, the coupling 1171, 1172 may be a resistive coupling or a capacitive coupling or an inductive coupling, or combinations of two or all three of these. The coupling 1171, 1172 may be accomplished by means of a physical connection, e.g. by means of static connection or an elastically bendable connection, such as a coax cable or insulated conductor which is rotated back and forth over a limited angular range, or may comprise a contactless electromagnetic connection, such as e.g. a capacitive or inductive coupling, for example as shown in FIG. 12 or FIG. 13. The coupling 1171, 1172 may be electrical or magnetic or electro-magnetic.

The end blocks 1131, 1132 may be mounted on a mounting surface 1181, e.g. on a lid or a door of a sputter device, whereby the end blocks 1131, 1132 are positioned on the side of the surface corresponding to the inside of the sputter system during operation, and whereby the electrical interfaces 1161, 1162 are located on the opposite side of the surface, i.e. the side corresponding to the outside of the sputter system during operation. The mounting surface 1181, e.g. the lid or door may be part of the device 1102.

The end blocks 1131, 1132 and the electrical interfaces 1161, 1162 are capable of transferring an RF power in the range of for example 0.5 kWatt to 100 kWatt, e.g. in the range of 1 to 30 kWatt, for example about 1 or 2 or 5 or 10 or 20 or 50 kWatt and having a frequency in the range of 0.3 MHz to 100 MHz, for example about 13.56 MHz. The amount of power lost inside the end blocks 1131, 1132, for example due to eddy currents or magnetic losses, or Joule heating in conductors and/or in the cooling liquid, is to be limited as much as possible.

At least one of the end blocks may additionally be provided for allowing passage of a cooling liquid, for example cooling water. Typically the input (supply) and output (drain) of the cooling water is organized from a single end block, whereby channels are arranged within the target tube, e.g. channels formed by walls of a tubular magnet bar holder housing as shown for example in FIG. 14(*a*), whereby openings or cavities in the walls are being used to bring the cooling fluid from one side to the other side of said walls. This is, however, not essential for the invention, and other ways of cooling may also be used.

At least one of the end blocks may additionally be provided with driving means, e.g. with a motor for rotating the sputter target tube 1170 around its longitudinal axis.

The device of the present invention is ideally suited for sputtering with a target tube 1170 comprising a non-conductive sputter material, e.g. a ceramic material or an oxide.

FIG. 11(*b*) to FIG. 11(*d*) illustrate possible use cases of the device 1102 of the present invention. It also illustrates examples of temporal behavior of the switching unit 680.

FIG. 11(*b*) illustrates a first method of using the device of FIG. 11(*a*), whereby alternatingly each end of the target tube is supplied with an RF power signal while the other end is terminated with an impedance. As shown in the table, in even time slots (indicated by 2n, whereby n is an integer number), the first end block 1131 is provided with RF power while the second end block 1132 is electrically terminated with an impedance Z. In odd time slots (indicated by 2n+1, whereby n is an integer number), the second end block 1132 is provided with RF power while the first end block 1131 is terminated with an impedance Z. Preferably the time slots have equal length, such that the duty cycle of the even and of the odd time slots is 50%. The resulting voltage waveform obtained by this method is shown by curve 993 of FIG. 9 for a target length of 1.5 m, and by curve 1093 of FIG. 10 for a target length of 3.5 m.

But of course the invention is not limited to fixed time slots of exactly 50%, but the advantageous effect of a more uniform erosion of the target tube will also be obtained when the time slots vary for example in a pseudo-random manner chosen between a predefined minimum and maximum value, such that the average time of the even time slots is about equal to the average time of the odd time slots within a certain margin, for example within +/−10%. Furthermore, the invention is not limited to time slots in which each fraction necessarily requires the same RF power level. Both varying time slot fractions and power levels within each time slot fraction provides freedom for adjusting erosion uniformity of the target tube.

Figures 11A, 11B, 11C, 11D:
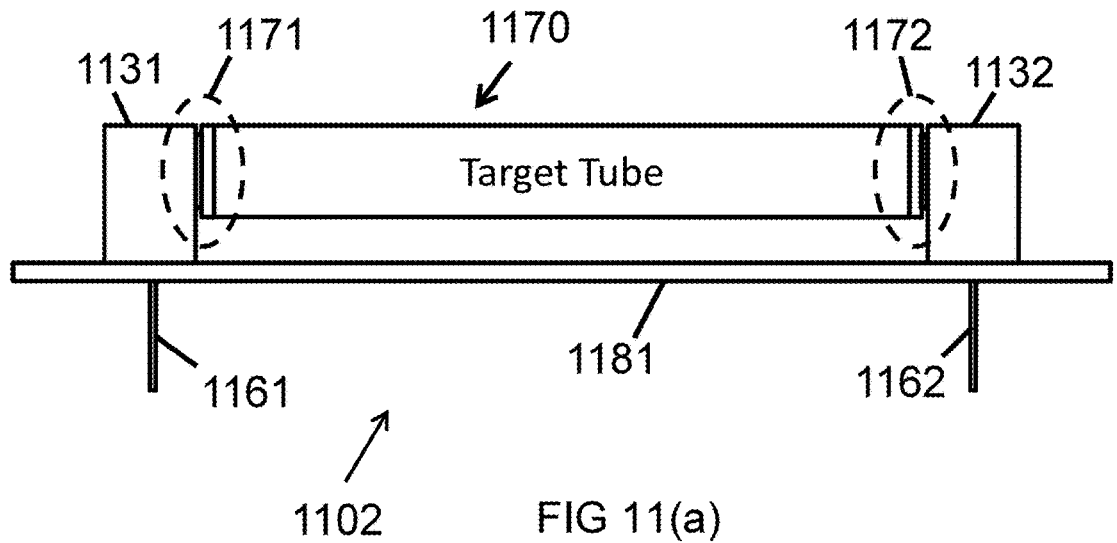
FIG. 11(a) is an example of a device with two end blocks as can be used in the system shown in FIG. 6 (the target tube itself is an optional part of the device).
FIG. 11(b) to (d) illustrates several possible switching configurations and corresponding methods for interconnecting an RF power source and one or two terminating impedances with the first and second end of the target tube.

FIG. 11(c) illustrates a variant of the method of FIG. 11(b), wherein the time is divided in groups of three time slots. The first and second time slot indicated by "3n" and "3n+1" (n being an integer value) correspond to the even and odd time slots of FIG. 11(b), except that their duty cycle is for example chosen to be 45%, and there is a third time slot indicated by "3n+2" wherein RF power is simultaneously applied to both ends of the sputter target. The latter time slot may for example have a duty cycle of 10%. But of course the invention is not limited to these values, and the first, second and third time slots may have duty cycles in the range of 1% to 99%, their sum being 100%. A different sequence order of the time slots is of course also possible. It is even possible to vary the duty cycles and power level within each fraction over time.

In case the system of FIG. 6 comprises multiple RF power supplies 697, and/or multiple terminating impedances 695, it is evident that many more variations are possible. For example, FIG. 11(d) shows a possible time schedule for a system having a single RF power source and two different terminating impedances Z1, Z2. As can be seen, in the first time slot of each period (indicated by "4n"), the second end of the target tube is connected to the first impedance Z1, while in the third time slot of each period (indicated by "4n+2") the second end of the target tube is connected to the second impedance Z2. In this way, a variable impedance can be emulated. Of course, the number of terminating impedances Z1, Z2 can be chosen larger than two, for example at least five, and the schedule may be adapted accordingly, for connecting the ends of the sputter target to each of the terminating impedances.

Figure 18:
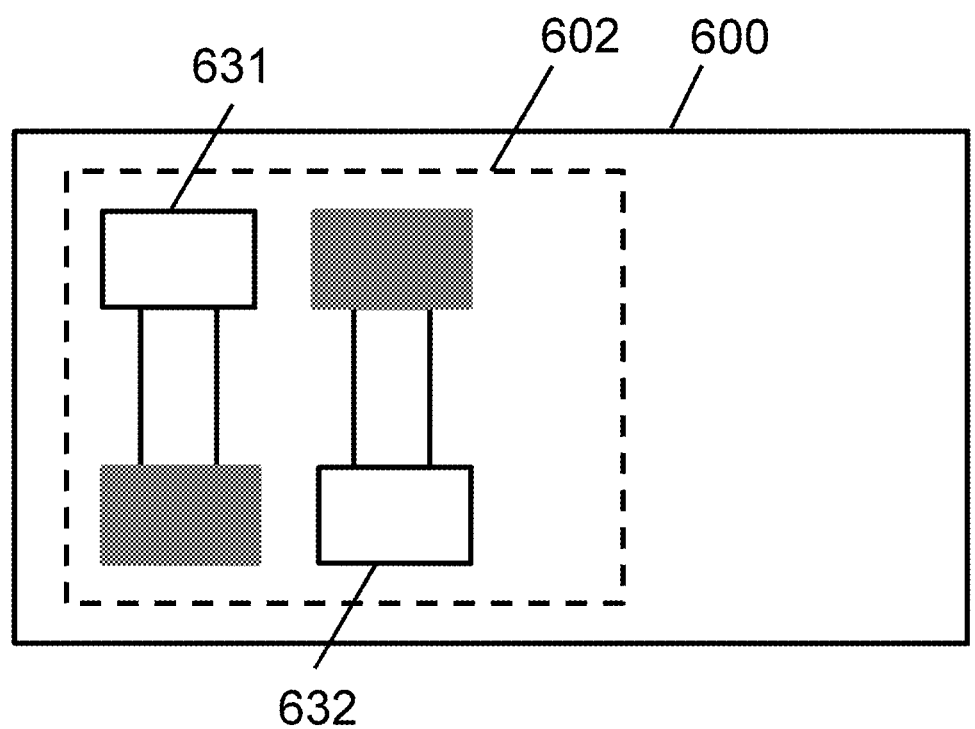
FIG. 18 is a block diagram representation of embodiments of the present invention, showing a device capable of mounting a target against one end block and another target against another end block at the opposite side of the sputter system, such that one target is powered with RF from one side and the other target is powered with RF from the opposite side. Each target may be terminated by a terminating impedance at its extremity which is not mounted against the end block from where it is powered with RF.

In alternative embodiments of the present invention, as illustrated schematically in FIG. 18, the device 602 for use in the sputter system 600 is configured for mounting a target assembly comprising at least two target tubes or sputter magnetrons. Hereto, the device 602 comprises at least two end blocks 631, 632 positioned at opposite sides of the sputter system. Each of the at least two end blocks 631, 632 are configured and mounted such that they can mount a different target tube or sputter magnetrons. In these embodiments, the target assembly may be powered actively with RF power at both sides of the assembly, but such that a single target tube or sputter magnetron is not actively powered continuously with RF power simultaneously at both extremities. At least one of the target tubes or sputter magnetrons may be powered actively from one side, while—simultaneously or not—at least another one of the target tubes or sputter magnetrons may be powered actively from the other side of the sputter system. This way, powering of opposite sides of the target assembly by RF power, in particular in this embodiment by powering a plurality of target tubes or magnetrons mounted on end blocks located at opposite sides of the sputter system, is obtained.

In an exemplary embodiment of the present invention a first target may be powered via a first end block 631 on one side and an adjacent second target is powered via a second end block 632 positioned on the opposite side. When during sputtering a substrate is moving relatively with respect to both targets, this will result in a sputtered coating which is originating from both targets. Since, in the embodiment explained, both targets are powered from only one side they will both erode in a non-uniform way. Also the coating from each of both targets separately will be non-uniform. Since both targets are powered from an opposite side, however, the controlling of the system may be done such that the combined coating is uniform. In this embodiment the targets may be reversed after a predetermined amount of processing time in order to achieve a more uniform erosion of the targets. This may for example be done at half of the lifetime of the target. In particular embodiments, sensors may be provided in the system to determine the amount of erosion occurring, and to therefrom calculate the life time. The targets may be physically reversed or, on the other hand, the operation of the end blocks may be reversed: if each target has an end block at both sides capable of handling RF signals, as illustrated in FIG. 18, the driving RF side may be changed after a certain period and simultaneously for both end block sets of the at least dual target configuration. As such: the condition as described for a single target may be implemented on a dual target configuration in which the switching frequency of powering opposite ends may be much smaller (longer in the same condition), because the uniformity is not negatively impacted. It may be a preferred embodiment that even for the dual target configuration, each side of each target has an RF compatible end block, which may either be used for delivering power or for impedance matching. Switching power delivery to the opposite side may be done at irregular or regular time intervals, for instance every minute, every hour, every day while uniformity is being guaranteed by having opposite powering on each of the targets of the at least dual target configuration.

In embodiments of the present invention a target may be present between two opposite end blocks 631, 632 (see for example FIG. 6). In these embodiments the device 602 may be adapted for alternatingly powering the opposite sides of the target assembly in the time domain.

In embodiments of the present invention alternatingly powering the opposite sides of the target assembly in the space domain (e.g. two targets powered from a different side) may be combined with also alternatingly powering in the time domain (e.g. the two targets may both be powered from both sides and this alternatingly in time). Thereby the uniformity of the coating may be increased even more and reversing the targets may not be required, similar as described hereinabove.

FIG. 12(a) to (c) show, in cross-section, three examples of capacitive coupling between two elements which are rotatable with respect to each other around an axis, as can be used in embodiments of a device and/or an assembly according to the present invention. FIG. 12(a) shows parallel circular disks (a), FIG. 12(c) shows a plurality of concentric cylinders, FIG. 12(b) shows something in between the structure of FIG. 12(a) and FIG. 12(b). Any of these structures may be used as coupling means in a device according to the present invention, allowing to have a rather large range of capacitance values, by varying the axial distance between the two elements. Particular embodiments, e.g. size and geometry can be chosen depending on the system needs. In variants of these embodiments (not shown), a region near the axis may be open, for example in the case of FIG. 12(a) this would result in two annular rings, and in the case of FIG. 12(c) this would result in the removal of some of the inner cylinders.

FIG. 13(a) to (b) show two examples of inductive coupling between two elements 131, 132 and 135, 136 which are rotatable with respect to each other around a common axis.

FIG. 13(a) shows a first element 131 e.g. a static element having a first coil 133, and a second element 132 e.g. a rotatable element, having a second coil 134. The elements and coils are shaped and arranged such that magnetic flux lines generated by the first coil 133 pass as much as possible through the second coil 134 to get a high coupling. The basic principles of "inductive coupling" are well known in the art, and need not be further explained here. It suffices to say that both windings 133, 134 are preferably applied around a magnetic material, which is preferably shaped such that the magnetic field lines, which are closed, can travel as much as possible through magnetic material (such as iron), and as little as possible through gaps. The gaps allow the elements 131, 132 to rotate with respect to each other.

FIG. 13(b) shows another embodiment with two elements 135, 136, where a first, inner element 135 may be stationary, and a second outer element 136 can rotate around the first element. The first coil 137 may be wound around part of the first element 135, the second coil 139 may be wound around a bushing 138, which is rotatably mounted on the inner element 135, so that the second coil 139 can be fixedly connected to the outer element 136 and can rotate along.

FIG. 14 to FIG. 17 are intended to disclose in more detail some examples of how an RF power signal can be applied to the end or sides of the sputter target, and/or how these ends or sides can be connected or coupled to a terminating impedance. The other elements of the system 600 shown in FIG. 6 or FIG. 18, for example the RF power source, the matching network, the switching unit, etc. are omitted from these drawings, but can be readily applied by the skilled person. FIG. 14 to FIG. 17 are illustrations for embodiments where the target assembly comprises a single target tube or sputter magnetron, but they are equally applicable, although not illustrated, to embodiments where the target assembly comprises a plurality of target tubes or sputter magnetrons, each mounted to end blocks which are not collinear.

Figure 14A:
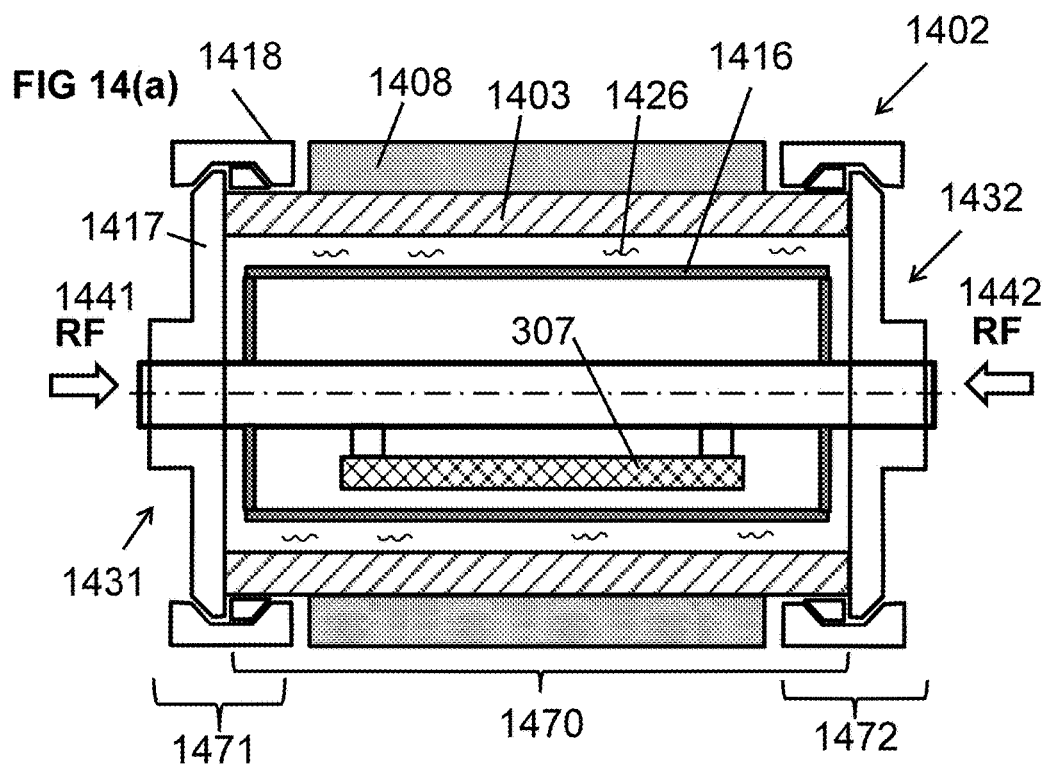
FIG. 14(a) to (b) are schematic representations of embodiments of a device as can be used in the system of FIG. 6.
Figure 14B:
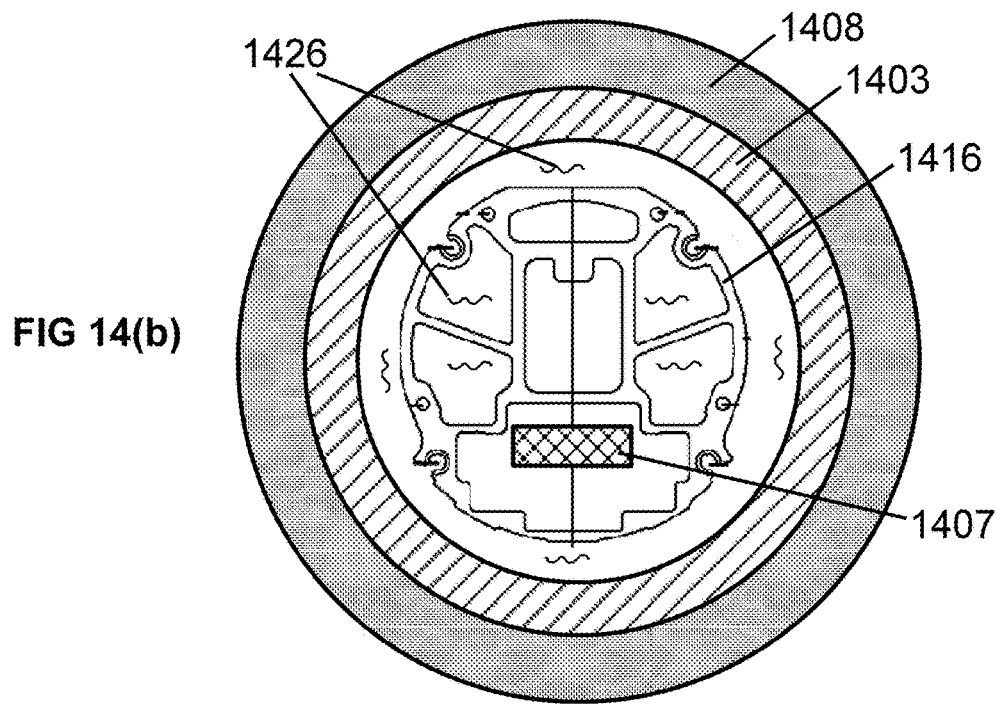

FIG. 14(a) is a schematic representation of a device or assembly 1402 according to an embodiment of the present invention. FIG. 14(a) shows a cross-section in a plane containing the central axis of the sputter target (or magnetron). FIG. 14(b) shows a cross section in a plane perpendicular to said axis.

The device 1402 shown contains a sputter target 1470, and a first end block 1431 (only part of which is shown) and a second end block 1432 (only part of which is shown). The end blocks are adapted for mechanically supporting the sputter target. The sputter target 1470 comprises a cylindrical metal backing tube 1403 with an outer surface whereto a sputter material 1408 is applied. Preferably at least one of the end blocks is provided with a motor or actuator for rotating the backing tube around its axis.

According to an advantageous aspect of the present invention, the end blocks are further adapted for transferring an RF power signal (schematically indicated by arrow 1441 and 1442, even though RF current is actually bi-directional) from one or more external power supplies (not shown) via or through the first resp. second end block 1431, 1432 to/from a first resp. second end of the backing tube 1403, and for coupling the first resp. second end of the backing to 1403 to one or more external terminating impedances (not shown) via or through the first resp. second end block.

It is pointed out that this drawing should not be interpreted that the RF power signals 1441, 1442 are necessarily simultaneously applied to both ends, but they may. In embodiments with a single target tube between two end blocks to which RF power can be applied, RF power signals may be applied to either one of the end blocks alternately, at least for a major portion of an operating cycle. In embodiments with at least two target tubes, each mounted on a different end block to which RF power can be applied, the end blocks in turn being positioned at opposite sides of the sputter system, the RF power signals may be applied to both end blocks simultaneously, as this way of working does not actively power a single target tube continuously with RF power at both extremities simultaneously. This does not exclude that at some occasions and for some time (but not continuously) all end blocks are being powered with RF power simultaneously with same or different power fractions. This can be in combination with continuous or pulsed DC applied to each of the end blocks as well.

At least one of the end blocks 1431, 1432 may be further adapted for supplying or for draining a cooling liquid 1426, e.g. cooling water, for cooling the backing tube 1403 during actual use in a sputter chamber.

Figure 15:
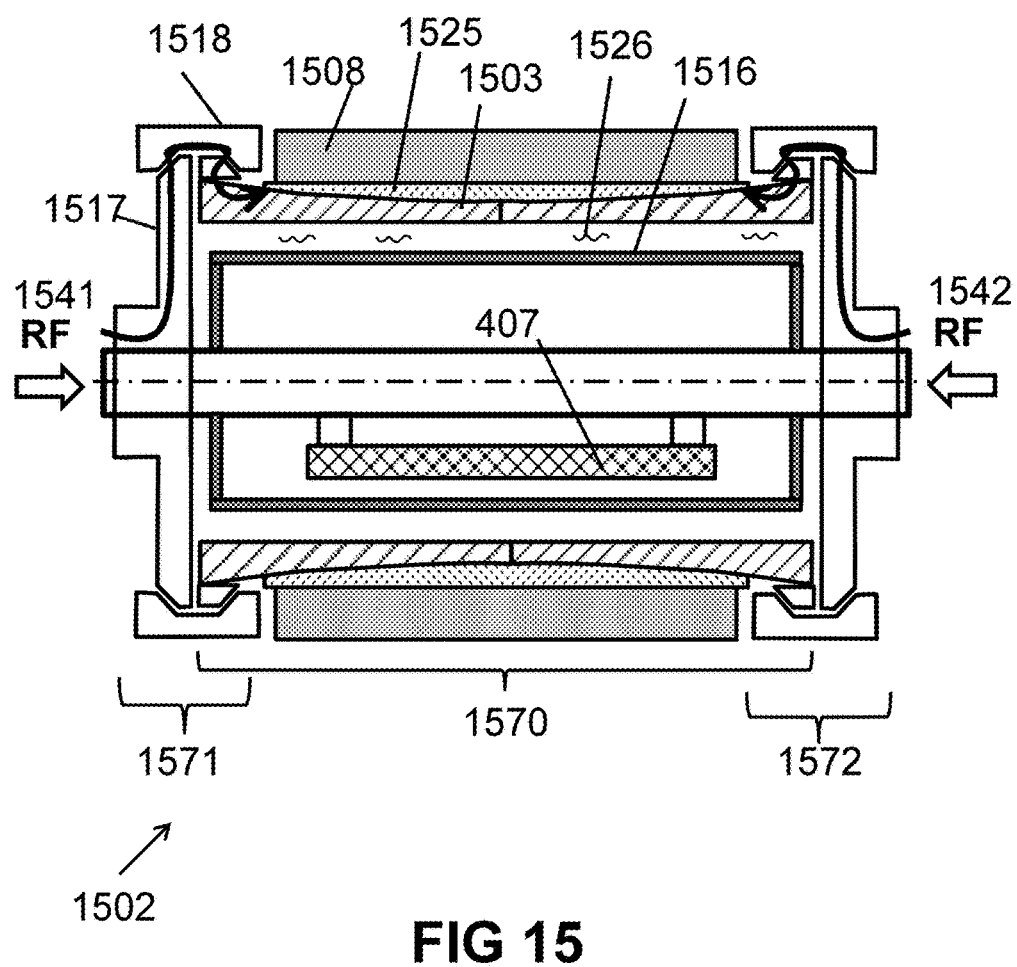
FIG. 15 is a schematic representation of a first particular device according to an embodiment of the present invention, whereby RF power is applied directly to the backing tube (e.g. via a flange), and whereby the backing tube has a variable outer diameter (but these features need not necessarily both be present).

Only part of the end blocks, in particular a flange 1417 and a bracket 1418 thereof, forming the couplings 1471, 1472 are represented herein, but the interested reader may consult for example US2013/0008777A1 for a more detailed description of other parts of such an end block. Indeed, as will be illustrated further, the RF power signals 1441 and 1442 may be applied in at least two principally different manners to the backing tube 1403, to create an electrical field which, during use in a sputter device, will interact with the plasma located in the vicinity of the sputter target:

(i) directly, by applying the RF power directly (e.g. via a resistive coupling) to the backing tube 1403, e.g. via a conductive flange 1417 and/or via a conductive bracket 1418 which are mounted in electrical contact with the backing tube 1403 (as illustrated for example in FIG. 15). This means that the RF signals 1441, 1442 need not be applied to an inner electrode, e.g. the tubular magnet holder structure 1416 (as is done in some prior art applications), in which case no substantial fraction of the RF power flows through the cooling liquid 1426;

(ii) indirectly, by applying the RF power 1441, 1442 to an inner electrode, e.g. the tubular magnet holder structure 1416 (as illustrated for example in FIG. 16 and FIG. 17), whereby a major part of the RF current flows through the cooling liquid 1426 from an outer surface of the inner electrode (e.g. magnet holder structure 1416) to the backing tube 1403, but abstraction of this difference is made in FIG. 14(a). FIG. 15 will show an example of coupling via the first principle (i), FIG. 16 and FIG. 17 will show examples of coupling via the second principle (ii).

A system or assembly comprising the device 1402 may further comprise any of the other components shown in FIG. 6(a), in particular: a switching unit, one or more RF power supplies, one or more matching networks, and one or more terminating impedances, although only one of each is shown in FIG. 6.

FIG. 14(b) shows the sputter target of FIG. 14(a) in cross section in a plane perpendicular to the axial direction. It is clearly visible that the tubular magnet holder structure 1416 is located within the backing tube 1403, and is surrounded by cooling liquid 1426, e.g. cooling water. Although the present invention is not limited to devices or assemblies or systems having the tubular magnet holder structure 1416 shown in FIG. 14(*b*), such an embodiment may offer specific advantages, such as allowing accurate positioning of the magnets 1407 or magnet array, and the formation of particular channels wherein the cooling liquid 1426 is allowed to stream, and the formation of compartments where no liquid can stream. The space between the outer wall of the magnet holder structure 1416 and the inner wall of the backing tube 1403 can also be seen as a channel.

The material of the backing tube 1403 is preferably a non-magnetic material with a relatively good electrical and thermal conductance. In view of the high RF frequencies, e.g. 13.56 MHz, skin effect will inevitably play an important role. At such a frequency the skin depth in metal such as copper or aluminum or a non-magnetic or low-magnetic stainless steel is in the order of about 1 micron to 1 mm, e.g. about 10 micron. For this reason, the backing tube 1404 and/or the tubular magnet bar holder 1416 (if present) may advantageously contain an outer layer of a highly electrically conductive material, such as e.g. copper or aluminum or silver or gold, while the core of the backing tube and of the tubular magnet bar holder 1416 can consist or may comprise e.g. "stainless steel 410" or "stainless steel 304" or copper or aluminum, or an aluminum alloy, or any other suitable material(s).

By providing a magnet holder structure 1416 with a relatively large outer diameter, for example at least 80% of the inner diameter of the backing tube, e.g. at least 85%, or at least 90% or at least 95%, not only the mechanical stability is increased, but also the entire space within the backing tube 1403 is subdivided in channels, so that the cooling can be managed in a better controlled way. In addition, in case (ii) mentioned above, whereby the RF current flows mainly through the outer surface of the magnet holder structure 1416 in a thin layer, the electrical resistance will decrease as the outer diameter of the magnet holder structure 1416 increases, and thus less power will be dissipated in the material of the tubular magnet holder structure 1416. Finally, by increasing the outer diameter of the tubular magnet holder structure, the distance between the outer wall of the tubular magnet holder structure 1416 and the inner wall of the backing tube decreases, hence the electrical resistance through the cooling liquid decreases, resulting in a better power efficiency.

By mounting the magnets 1407 in a separate compartment where the cooling liquid cannot flow, corrosion of the magnets 1407 can be avoided, by avoiding direct contact between the cooling liquid and the magnets.

Preferably the position of the magnets is adjustable, either manually (off-line, e.g. using screws) or dynamically (on-line, e.g. using actuator means and control circuitry).

On the outside of the backing tube 1403 a sacrificial layer 1408 with sputter material is present. The sputter material may be composed on an electrically non-conducting material, e.g. a ceramic material or an oxide. It is possible to sputter such materials by using RF power signals.

FIG. 15 shows a device or assembly 1502 according to an embodiment of the present invention. This embodiment can be seen as a special case of the generic device or assembly shown in FIG. 14, for the particular embodiment of a single target tube or sputter magnetron being mounted between the first and second end blocks. These end blocks 1531, 1532 (only a flange 1517 and a bracket 1518 of which are shown) are adapted for each transferring the RF power 1541, 1542 signals mainly directly to the backing tube 1503, meaning that the RF current will not primarily flow through the magnet holder structure 1516 and the cooling liquid 1526, but for example through said conductive flange 1517 and said conductive bracket 1518.

In the drawing of FIG. 15 the backing tube 1503 furthermore has a variable outer diameter, but this feature is independent to the manner in which the RF power is applied to the backing tube, and moreover is not mandatory. On the other hand, when present, it may further help to improve the uniformity of the electrical field generated by the RF signals, hence together they provide a synergistic effect. The shape of the backing tube illustrated in FIG. 15 is such that the backing tube is thinner in the middle than at its extremities. For embodiments where a plurality of target tubes or sputter magnetrons are mounted each on an end block which can supply RF power thereto, the thickness of the backing tube could for example be diminishing from the side where the RF power is applied towards the other extremity. Preferably this reduction in thickness occurs gradually.

In the example of FIG. 15 a dielectric 1525 is applied to the metallic backing tube 1503, and on top of that, the sputter material 1508 is provided. By suitably varying the distance between the outer surface of the electrically conducting backing tube 1503 and the plasma (not shown), in other words, by choosing a suitable profile of the outer diameter of the backing tube over the length of the tube, as can e.g. be obtained by simulations or even by trial and error, the electrical capacitance between the backing tube 1503 and the plasma can be varied over the length of the backing tube 1503, and can be specifically chosen so as to obtain a more uniform erosion of the target material 1508 than is possible with backing tubes having a constant diameter. In other words, by choosing an appropriate profile, the curves 993 and 1093 (for a target tube of 1.5 m or 3.5 m) can be further flattened. This principle also works for target tubes having another length in the range of for example 1.0 m to 5.0 m, and also works for other frequencies, higher or lower than 13.56 MHz, for example in the range of 300 kHz to 100 MHz.

In variants (not shown) of the embodiment of FIG. 15, the outer diameter of the dielectric 1525 is not constant, but varies over the length of the target. Again, the profile may be designed (e.g. by means of simulation) to obtain a more uniform voltage profile.

In variants (not shown) of the embodiment of FIG. 15, the backing tube 1503 has a constant outer diameter, but a variable inner diameter to obtain the same effect.

In variants (not shown) of the embodiment of FIG. 15, the backing tube 1503 has a constant inner and outer diameter, but no dielectric layer 1525.

It should be noted that the representation of FIG. 15 is only schematic, and that certain elements, such as the flange 1517 and the bracket 1518 are deliberately drawn apart, with openings between them, for illustrative purposes, to clearly show the different elements. Other components such as O-rings and the like, are also omitted from the drawings.

The exact shape and dimensions of the first and second end block 1531, 1532 are less important, but in the embodiment of FIG. 15 it is advantageous that the RF currents (schematically represented by the black arrows) can flow through at least part of the material of the end blocks 1531, 1532, e.g. through an electrically conductive flange 1517 and/or an electrically conductive bracket 1518 to/from the electrically conductive backing tube 1503, which is in direct electrical contact thereto. But of course, the invention is not limited to end blocks having a flange and bracket, but other mounting techniques such as e.g. an end block having internal screw thread for mounting a target tube 1570 having a backing tube 1503 with an external screw thread are also possible, as long as there is a direct electrical contact between the end blocks and the backing tube.

In order to guarantee a good electrical contact between the flange 1517 and the bracket 1518 and the backing tube 1503, optionally a copper ring (not shown) and/or metallic spring or the like may be added between the bracket 1518 and the backing tube 1503.

Although in the drawing only the labels "RF" are used to indicate the RF current paths via or through the first and second end blocks, it is clear that the same electrical path via the flanges and brackets will be used also when one end block is coupled to an RF power source, and the other end block is coupled to a terminating impedance, or any other scenario as discussed above in relation to FIG. 11(*b*) to FIG. 11(*d*).

The electrical interfaces of the end blocks 1531, 1532 for connection to the switch unit are not explicitly shown, but can e.g. be implemented as electrical conductors, e.g. coax cables, connected to brushes, e.g. carbon brushes (not shown) in physical contact with the rotating flange 1517, as is known for example from DC motors, but other electrical interfaces are also possible.

Figure 16:
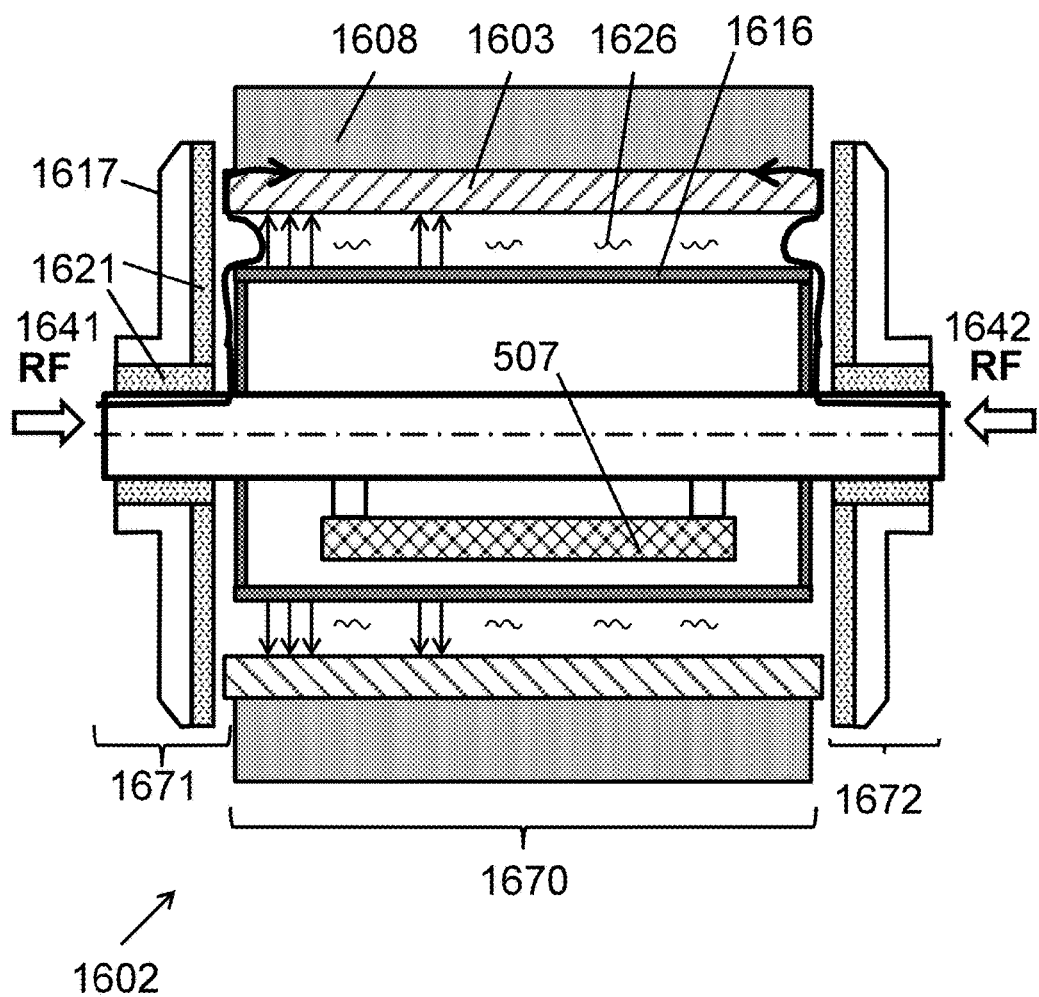
FIG. 16 is a schematic representation of a second particular device according to embodiments of the present invention, whereby RF power is applied to the stationary tubular magnet holder structure, and from there via a cooling liquid indirectly to the backing tube.

FIG. 16 shows a device or assembly 1602 according to a third embodiment of the present invention, which is also a special case of the more general embodiment shown in FIG. 14. In the embodiment of FIG. 16 the first and second end block 1631, 1632 (only a flange 1617 of which is shown) are adapted for allowing passage of the first resp. second RF power signal 1641, 1642 via an inner tubular magnet holder structure 1616, from where the RF power will be further transferred to the backing tube 1603 through the cooling liquid 1626. In order to prevent the RF current to flow through the material of the flange 1617, the flange is electrically insulated with respect to the tubular magnet holder structure 1616, as schematically illustrated by means of the insulation material 1621. Also this embodiment can be applied to systems comprising a single RF transferring end block per target tube or sputter magnetron.

Figure 17:
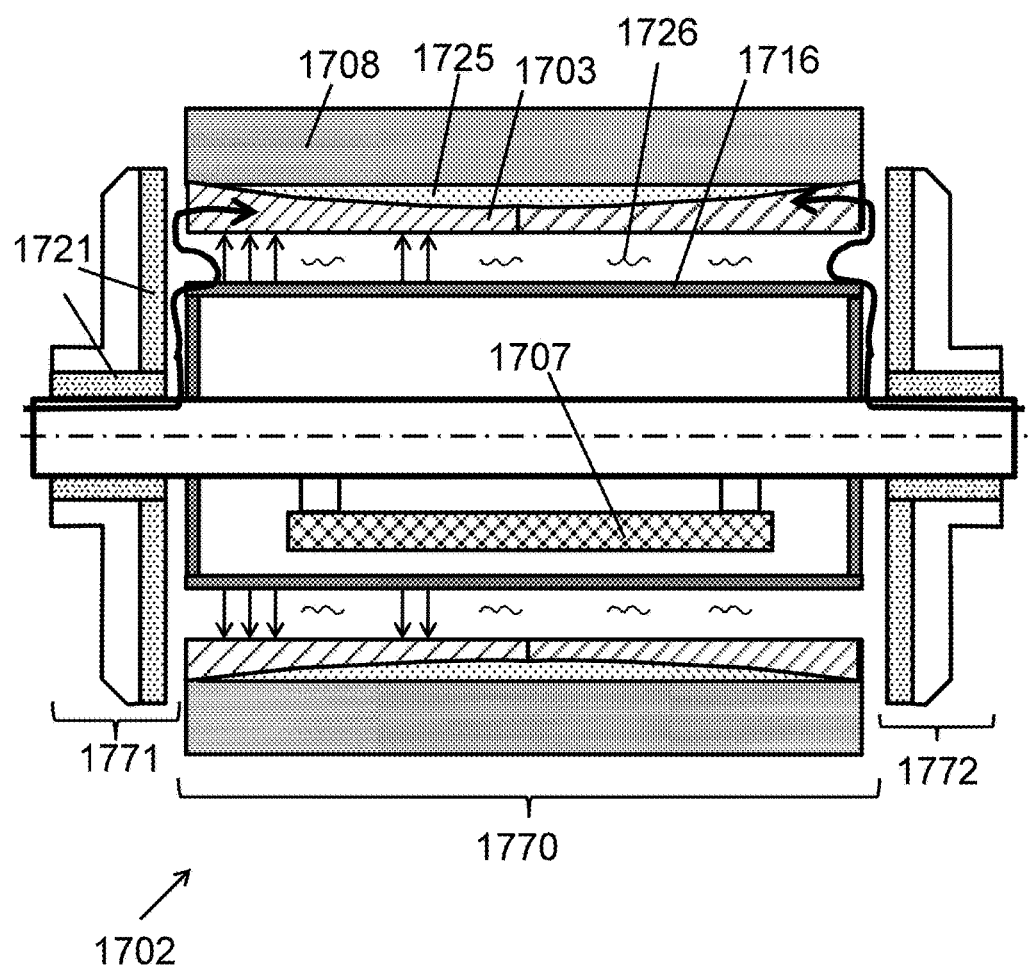
FIG. 17 shows a variant of the device of FIG. 16, whereby the backing tube has a variable outer diameter.

FIG. 17 shows a variant of the embodiment of FIG. 16, whereby the metal backing tube 1703 has a variable outer diameter, and a dielectric 1725 applied between the metal backing tube 1703 and the sputter material 1708, as discussed above in relation to FIG. 15. What is mentioned above (for the embodiments of FIG. 14 to FIG. 16) in relation to the other system components (e.g. switching unit, RF power source/supplies, terminating impedance(s) is also applicable here). The RF power signal may be applied to an electrical interface mounted on the stationary inner tube, e.g. via a physical connector. It is noted that in this case no carbon brush is required, but the RF power signal may e.g. be connected by means of a coax cable between the switching unit and the stationary tubular magnet holder structure 1716, or in any other way suitable for transferring an RF power signal of 1 to 100 kWatt, and having a frequency between 300 kHz to 100 MHz, e.g. a power signal of 1 kWatt to 100 kWatt and a frequency of about 13.56 MHz. Also this embodiment can be applied to systems comprising a single RF transferring end block per target tube or sputter magnetron.

It is pointed out that the representation of FIG. 16 and FIG. 17 are only schematic representations, and that the components such as the flange 1717 and the insulating material 1721 are drawn at a distance from the backing tube 1703 for illustrative purposes, to clearly show the different elements. Also other components such as O-rings etc. are omitted from the drawings.

The invention claimed is:

1. A device for use in a sputter system, the device comprising:
    at least a first and a second end block, wherein the first and second end blocks are positioned at opposite sides of the sputter system,
    wherein the device is adapted for, during a first period of time, actively powering a target assembly comprising at least one target tube or sputter magnetron, when mounted on the first and second end blocks, with an RF power component at one side of the target assembly, and for actively powering, during a second period of time, the target assembly with an RF power component at the opposite side of the target assembly,
    wherein the device is adapted such that the target assembly, when mounted, is not actively powered continuously with RF power simultaneously at both extremities of the at least one target tube or sputter magnetron.

2. The device according to claim 1, wherein:
    the first end block and the second end block are oriented towards each other and are positioned at a predefined distance from each other for holding the at least one target tube or sputter magnetron therebetween, the target tube being a cylindrical sputter target tube;
    the first end block has first coupling means for coupling a first end or first side of the sputter magnetron or target tube to an electrical interface of the first end block, this electrical interface being alternatingly connectable to an RF power source and to at least one terminating impedance;
    the second end block has second coupling means for coupling a second end or second side of the sputter magnetron or target tube, opposite the first end or first side, to an electrical interface of the second end block, this electrical interface being alternatingly connectable to an RF power source and to at least one terminating impedance.

3. The device according to claim 2, wherein the electrical interface of the first end block is connectable to a first RF power source and to at least one terminating impedance, and wherein the device is adapted for selectively transferring a first RF power component originating from said first RF power source to said first end or first side of the sputter magnetron or target tube at a first moment in time, and for electrically terminating said first end or first side of the sputter magnetron or target tube with the at least one terminating impedance at a second moment in time, different from the first moment;
    and wherein the electrical interface of the second end block is connectable to a second RF power source and to at least one terminating impedance, and wherein the device is adapted for selectively transferring a second RF power component originating from said second RF power source to said second end or second side of the sputter magnetron or target tube at a third moment in time, and for electrically terminating said second end or second side of the sputter magnetron or target tube with the at least one terminating impedance at a fourth moment in time, different from the third moment.

4. The device according to claim 1, further comprising said mounted target assembly comprising the at least one target tube or sputter magnetron.

5. The device according to claim 4, wherein the at least one target tube comprises a sputter target material being an electrically non-conductive material.

6. The device according to claim 1, wherein each of the first and second end block is capable of transferring or allowing passage of an RF power component to the at least one target tube while the at least one target tube is rotating around its longitudinal axis.

7. The device according to claim 1, wherein at least one of the first and second end block is adapted for supporting a tubular magnet holder structure within the at least one target tube, wherein the tubular magnet holder structure is capable of transferring an RF power component.

8. An assembly comprising:
a device for use in a sputter system, the device comprising:
at least a first and a second end block, wherein the first and second end blocks are positioned at opposite sides of the sputter system,
wherein the device is adapted for, during a first period of time, actively powering a target assembly comprising at least one target tube or sputter magnetron, when mounted on the first and second end blocks, with an RF power component at one side of the target assembly, and for actively powering, during a second period of time, the target assembly with an RF power component at the opposite side of the target assembly; and
a control unit for controlling powering of opposite sides of the target assembly by RF power such that the target assembly, when mounted, is not actively powered continuously with RF power simultaneously at both extremities of the at least one target tube or sputter magnetron.

9. An assembly according to claim 8, wherein the control unit comprises a switching unit connectable to an RF power source delivering the RF power component and to at least one terminating impedance,
the switching unit comprising switching means adapted for selectively connecting the RF power source to an electrical interface of the first end block, and for selectively connecting the RF power source to an electrical interface of the second end block, and for selectively connecting the at least one terminating impedance to the electrical interface of the first end block; and for selectively connecting the at least one terminating impedance to the electrical interface of the second end block.

10. The assembly according to claim 9, further comprising the RF power source, the RF power source being adapted for providing a power signal of 0.5 kWatt to 100 kWatt and having a frequency in the range of 0.3 MHz to 100 MHz.

11. The assembly according to claim 9, further comprising a first matching network arranged between said RF power source and said switching unit.

12. The assembly according to claim 9, further comprising said at least one terminating impedance.

13. The assembly according to claim 9, further comprising means for generating a first power fraction and a second power fraction, and a controller for configuring the switching means in such a way that:
the RF power component or the first power fraction is applied to the electrical interface of the first end block while the at least one terminating impedance is coupled to the electrical interface of the second end block during a first time fraction of a period;
the RF power component or the second power fraction is applied to the electrical interface of the second end block while the at least one terminating impedance is coupled to the electrical interface of the first end block during a second time fraction of a period.

14. The assembly according to claim 9, further comprising an RF power splitter for generating a first power fraction and a second power fraction, and a controller for configuring the switching means in such a way that:
the RF power component or the first power fraction is applied to the electrical interface of the first end block, while the at least one terminating impedance is coupled to the electrical interface of the second end block during a first time fraction of a period;
the RF power component or the second power fraction is applied to the electrical interface of the second end block, while the at least one terminating impedance is coupled to the electrical interface of the first end block during a second time fraction of a period;
the first power fraction is applied to the electrical interface of the first end block and the second power fraction is applied to the electrical interface of the second end block during a third time fraction of a period.

15. A method of providing RF power to a target assembly comprising at least one target tube or sputter magnetron mounted on at least a first and a second end block positioned at opposite sides of a sputter system, the method comprising powering opposite sides of the target assembly by RF power such that the target assembly is actively powered with RF power at both sides of the target assembly, and such that the target assembly is not actively powered continuously with RF power simultaneously at both extremities of at least one target tube or sputter magnetron.

16. The method of providing RF power according to claim 15, the method comprising the steps of:
using the target assembly in a sputter system comprising:
at least a first and a second end block, wherein the first and second end blocks are positioned at opposite sides of the sputter system, wherein the device is adapted for actively powering, during a first period of time, the target assembly comprising the at least one target tube or sputter magnetron, when mounted on the first and second end blocks, with an RF power component at one side of the target assembly, and is adapted for actively powering, during a second period of time, with an RF component at the opposite side of the target assembly, such that the target assembly, when mounted, is not actively powered continuously with RF power simultaneously at both extremities of at least one target tube or sputter magnetron, and
a control unit for controlling powering of opposite sides of the target assembly by RF power such that the target assembly, when mounted, is not actively powered continuously with RF power simultaneously at both extremities of at least one target tube or sputter magnetron, wherein the control unit comprises a switching unit connectable to an RF power source providing the RF power and to at least one terminating impedance, the switching unit comprising switching means adapted for selectively connecting the RF power source to an electrical interface of the first end block, and for selectively connecting the RF power source to an electrical interface of the second end block, and for selectively connecting the at least one terminating impedance to the electrical interface of the first end block; and for selectively connecting the at least one terminating impedance to the electrical interface of the second end block;

connecting a first port of the switching unit to an output of an RF power source for receiving an RF power component;

connecting a second port of the switching unit to at least one terminating impedance;

configuring the switching means for selectively transferring the RF power component or a first fraction thereof to a third port of the switching means connectable to the electrical interface of the first end block, and/or configuring the switching means for selectively transferring the RF power component or a second fraction thereof to a fourth port of the switching means connectable to the electrical interface of the second end block, and/or configuring the switching means for selectively coupling the at least one terminating impedance to said third port of the switching means, and/or configuring the switching means for selectively coupling the at least one terminating impedance to said fourth port of the switching means.

17. The method according to claim 16, comprising the steps of:

configuring the switching means for transferring the RF power component or a first fraction thereof to the electrical interface of the first end block while coupling the at least one terminating impedance to the electrical interface of the second end block during a first time fraction of a period; and wherein configuring the switching means for transferring the RF power component or a second fraction thereof to the electrical interface of the second end block while coupling the at least one terminating impedance to the electrical interface of the first end block during a second time fraction of a period.

18. The method according to claim 16, wherein the switching unit further comprises an RF power splitter for providing a first power fraction and a second power fraction, the method comprising the steps of:

configuring the switching means for applying the RF power component or the first power fraction to the electrical interface of the first end block while coupling the at least one terminating impedance to the electrical interface of the second end block during a first time fraction of a period; and configuring the switching means for applying the RF power component or the second power fraction to the electrical interface of the second end block while coupling the at least one terminating impedance to the electrical interface of the first end block during a second time fraction of a period;

configuring the switching means for simultaneously applying the first power fraction to the electrical interface of the first end block and for applying the second power fraction to the electrical interface of the second end block during a third time fraction of a period.

* * * * *